United States Patent
Richardson et al.

(10) Patent No.: US 10,541,140 B2
(45) Date of Patent: Jan. 21, 2020

(54) PROCESS FOR FILLING VIAS IN THE MICROELECTRONICS

(75) Inventors: Thomas B. Richardson, Killingworth, CT (US); Joseph A. Abys, Guilford, CT (US); Wenbo Shao, Millford, CT (US); Chen Wang, New Haven, CT (US); Vincent Paneccasio, Jr., Madison, CT (US); Cai Wang, Milford, CT (US); Xuan Lin, Northford, CT (US); Theodore Antonellis, Bethany, CT (US)

(73) Assignee: MACDERMID ENTHONE INC., Waterbury, CT (US)

( * ) Notice: Subject to any disclaimer, the term of this patent is extended or adjusted under 35 U.S.C. 154(b) by 800 days.

(21) Appl. No.: 13/981,974

(22) PCT Filed: Jan. 26, 2012

(86) PCT No.: PCT/US2012/022758
§ 371 (c)(1),
(2), (4) Date: Jan. 8, 2014

(87) PCT Pub. No.: WO2012/103357
PCT Pub. Date: Aug. 2, 2012

(65) Prior Publication Data
US 2014/0120722 A1     May 1, 2014

Related U.S. Application Data

(60) Provisional application No. 61/436,569, filed on Jan. 26, 2011.

(51) Int. Cl.
*H01L 21/288*     (2006.01)
*C25D 3/38*     (2006.01)
(Continued)

(52) U.S. Cl.
CPC ............ *H01L 21/2885* (2013.01); *C25D 3/38* (2013.01); *C25D 5/02* (2013.01); *C25D 5/18* (2013.01);
(Continued)

(58) Field of Classification Search
CPC ............... H01L 21/2885; H01L 21/288; H01L 21/76873; H01L 21/76879;
(Continued)

(56) References Cited

U.S. PATENT DOCUMENTS 6,024,856 A     2/2000     Haydu et al.
6,776,893 B1     8/2004     Too et al.
(Continued)

FOREIGN PATENT DOCUMENTS

EP     1598449 A2     11/2005
JP     04-187793     7/1992
(Continued)

OTHER PUBLICATIONS

Written Opinion, PCT/US2012/022758, dated May 7, 2012, 7 pages.
(Continued)

*Primary Examiner* — Julia Slutsker
(74) *Attorney, Agent, or Firm* — Carmody Torrance Sandak & Hennessey LLP

(57) ABSTRACT

A process for metalizing a through silicon via feature in a semiconductor integrated circuit device, the process including, during the filling cycle, reversing the polarity of circuit for an interval to generate an anodic potential at said metalizing substrate and desorb leveler from the copper surface within the via, followed by resuming copper deposition by re-establishing the surface of the copper within the via as the cathode in the circuit, thereby yielding a copper filled via feature.

24 Claims, 8 Drawing Sheets

(51) Int. Cl.
*C25D 5/18* (2006.01)
*H01L 21/768* (2006.01)
*C25D 7/12* (2006.01)
*C25D 5/02* (2006.01)

(52) U.S. Cl.
CPC ........ *C25D 7/123* (2013.01); *H01L 21/76873* (2013.01); *H01L 21/76879* (2013.01); *H01L 21/76898* (2013.01)

(58) Field of Classification Search
CPC ..... H01L 21/76898; C25D 5/02; C25D 7/123; C25D 5/18; C25D 3/38
See application file for complete search history.

(56) References Cited

U.S. PATENT DOCUMENTS

| | | | |
|---|---|---|---|
| 6,793,795 | B1 | 9/2004 | Meyer et al. |
| 6,946,065 | B1* | 9/2005 | Mayer ...................... C25D 3/02 205/102 |
| 7,303,992 | B2 | 12/2007 | Paneccasio et al. |
| 7,316,772 | B2 | 1/2008 | Commander et al. |
| 7,670,950 | B2 | 3/2010 | Richardson et al. |
| 2004/0011654 | A1 | 1/2004 | Nakamura |
| 2005/0153546 | A1* | 7/2005 | Ahrens et al. ................ 438/677 |
| 2006/0141784 | A1 | 6/2006 | Paneccasio, Jr. et al. |
| 2006/0151328 | A1 | 7/2006 | Reents et al. |
| 2008/0006850 | A1 | 1/2008 | Ribnicek et al. |
| 2009/0035940 | A1 | 2/2009 | Richardson et al. |
| 2009/0301889 | A1 | 12/2009 | Reents et al. |
| 2010/0041226 | A1 | 2/2010 | Reid et al. |
| 2010/0126872 | A1 | 5/2010 | Paneccasio, Jr. et al. |
| 2010/0200412 | A1 | 8/2010 | Reid et al. |
| 2010/0206737 | A1 | 8/2010 | Preisser |

FOREIGN PATENT DOCUMENTS

| | | |
|---|---|---|
| JP | 2009-289828 | 12/2009 |
| WO | 2004097932 A2 | 11/2004 |
| WO | 2007112971 A2 | 10/2007 |
| WO | 2012103357 A1 | 8/2012 |

OTHER PUBLICATIONS

International Search Report, PCT/US2012/022758, dated May 7, 2012, 5 pages.

International Preliminary Report on Patentability, PCT/US2012/022758, dated Jul. 30, 2013, 1 page.

Schaper et al., "Architectural Implications and Process Development of 3-D VLSI Z-Axis Interconnects Using Through Silicon Vias", IEEE Transactions on Advanced Packaging, vol. 28, No. 3, Aug. 2005.

Yang et al., "Through Silicon Via Filling Process Using Pulse Reversal Plating", presented at 2009 International Conference on Electronic Packaging Technology & High Density Packaging.

Beica et al., "Through Silicon Via Copper Electrodeposition for 3D Integration", Semitool, presented at 2008 Electronic Components and Technology Conference.

Hofmann et al., "Investigations regarding TSV filling for 3D integration by Periodic Pulse Reverse plating with and without additives", Microelectronic Engineering, 2010, 4 pages.

Beica et al., "Copper Electrodeposition for 3D Integration", DTIP of MEMS & MOEMS, Apr. 9-11, 2008, 6 pages.

Beica et al., Copper Electrodeposition for 3D Integration, Design, Test, Integration and Packaging of MEMS/MOEMS Symposium (2008) pp. 127-131.

* cited by examiner

PROCESS FOR FILLING VIAS IN THE MICROELECTRONICS

REFERENCE TO RELATED APPLICATIONS

This application is a U.S. national stage application of International Patent Application No. PCT/US2012/022758, filed Jan. 26, 2012, and claims the benefit of U.S. Provisional Application No. 61/436,569, filed Jan. 26, 2011, the entire disclosures of which are incorporated herein by reference.

This invention relates to creating conductive paths in the manufacture of microelectronic devices, and more particularly to a method for filling vias, especially vias that are relatively deep and/or have a relatively small entry dimension.

Among the applications for the invention is the creation of so-called "through silicon via" interconnections of integrated circuit chips. The demand for semiconductor integrated circuit (IC) devices such as computer chips with high circuit speed and high circuit density requires the downward scaling of feature sizes in ultra-large scale integration (ULSI) and very-large scale integration (VLSI) structures. The trend to smaller device sizes and increased circuit density requires decreasing the dimensions of interconnect features and increasing their density. An interconnect feature is a feature such as a via or trench formed in a dielectric substrate which is then filled with metal, typically copper, to yield an electrically conductive interconnect. Copper, having better conductivity than any metal except silver, is the metal of choice since copper metallization allows for smaller features and uses less energy to pass electricity. In damascene processing, interconnect features of semiconductor IC devices are metallized using electrolytic copper deposition.

A patterned semiconductor integrated circuit device substrate, for example, a device wafer or die, may comprise both small and large interconnect features. Typically, a wafer has layers of integrated circuitry, e.g., processors, programmable devices, memory devices, and the like, built into a silicon substrate. Integrated circuit (IC) devices have been manufactured to contain small diameter vias and sub-micron sized trenches that form electrical connections between layers of interconnect structure. These features have dimensions on the order of about 150 nanometers or less, such as about 90 nanometers, 65 nanometers, or even 45 nanometers.

Plating chemistry sufficient to copper metallize small size via and trench features has been developed and finds use in the copper damascene method. Copper damascene metallization relies on superfilling additives, i.e., a combination of additives that are referred to in the art as accelerators, levelers, and suppressors. These additives act in conjunction in a manner that can flawlessly fill copper into the interconnect features (often called "superfilling" or "bottom up" growth). See, for example, Too et al., U.S. Pat. No. 6,776,893, Paneccasio et al., U.S. Pat. No. 7,303,992, and Commander et al., U.S. Pat. No. 7,316,772, the disclosures of which are hereby incorporated as if set forth in their entireties. Currently available electrolytic copper deposition systems that rely on superfilling additives can fill small size features at current densities as high as 6 A/dm$^2$ and in as little as 20 seconds, 10 seconds, or less.

In another form, a wafer may be constructed to comprise one or more very deep via. This type of via architecture is known in the art as "through silicon via" (TSV). In some devices, through silicon vias allow electrical interconnection between 2 or more wafers bonded to each other in a three-dimensional wafer stack. After being formed, the 3D wafer stack may be diced into stacked dies ("chips"), each stacked chip having multiple tiers ("layers") of integrated circuitry. Depending on where and when the vias are made, they can be characterized as "Via First—Before FEOL," or "Via First—After BEOL." In both cases, the vias are made before wafer/die attachment or bonding. The third category of TSV is via last, which means that the via is constructed after wafer/die attachment or bonding.

Through silicon vias are critical components of three-dimensional integrated circuits, and they can be found in RF devices, MEMS, CMOS image sensors, Flash, DRAM, SRAM memories, analog devices, and logic devices.

The depth of a TSV depends on the via type (via first or via last), and the application. Via depth can vary from on the order of about 20 microns to about 500 microns, typically between about 50 microns and about 250 microns or between about 25 and about 200 microns, e.g., between about 50 and about 125 microns. Via openings in TSV have had entry dimensions, such as the diameter, on the order of between about 200 nm to about 200 microns, such as between about 1 and about 75 microns, e.g., between about 2 and about 20 microns. In certain highly dense integrated circuit chip assemblies, the via entry dimension is preferably or necessarily small, e.g., in the range of 2 micron to 20 microns.

Exemplary vias for which the process of the invention is adapted would include 5μ wide×40μ deep, 5μ wide×50μ deep, 6μ wide×60μ deep, and 8μ wide×100μ deep. Thus, it may be seen that the process of the invention is adapted for filling vias having an aspect ratio>3:1, typically greater than 4:1, advantageously in the range between about 3:1 and about 100:1 or between 3:1 and 50:1, more typically in the range between about 4:1 and about 20:1, still more typically in the range between about 5:1 and about 15:1. However, it will be understood that the process is quite effective for filling vias of distinctly lower aspect ratio, e.g., 3:1, 2:1, 1:1, 0.5:1 or even 0.25:1 or lower. Thus, while the novel process offers particular advantages in the case of high aspect ratios, the application of the process to filling lower aspect ratio vias is fully within the contemplation of the invention.

In filling deep via, and especially deep vias with relatively small entry dimensions, it has been found difficult to maintain satisfactory deposition rates throughout the filling process. As the extent of filling exceeds 50%, the deposition rate typically declines, and the rate continues to drop as a function of the extent of filling. The overburden may get thicker as a result. In addition, due to the adsorption of the leveler onto the sidewalls and bottom copper surface as discussed hereinbelow, the impurities content of the deposit may also tend to increase. Deep vias are also vulnerable to formation of seams and voids, a tendency that may also be aggravated where entry dimension is small and aspect ratio is high.

It is known in the art to use pulse currents, typically including reverse pulses in which the electrodeposition substrate becomes anodic during part of the deposition cycle. As described, e.g., in U.S. Pat. No. 6,793,795, reversing pulse currents are advantageous in allowing the use of insoluble, dimensionally stable anodes in the plating process without polarization of the anode due to release of oxygen on the anode surface.

Reverse pulses and off periods and also mass transfer of copper ions from the bulk electrolytic plating solution are useful to replenish the copper ion concentration in the boundary layer adjacent to the metalizing surface, thus avoiding or remedying cathode polarization and assuring the copper deposition proceeds in preference to unwanted cathodic reactions such as hydrogen generation and burning.

SUMMARY OF THE INVENTION

Briefly, the invention is directed to a process for metalizing a through silicon via feature in a semiconductor integrated circuit device. The device comprises a surface having a via feature therein, the via feature comprising a sidewall extending from said surface, and a bottom. The sidewall, bottom and said surface have a metalizing substrate thereon for deposition of copper. The via feature has an entry dimension between 1 micrometers and 25 micrometers, a depth dimension between 50 micrometers and 300 micrometers, and an aspect ratio greater than about 2:1. The metalizing substrate comprises a seed layer and provides a cathode for electrolytic deposition of copper thereon. In the process, the metalizing substrate is contacted with an electrolytic copper deposition composition. The deposition composition comprises a source of copper ions, an acid component selected from among an inorganic acid, an organic sulfonic acid, and mixtures thereof, an accelerator, a suppressor, a leveler, and chloride ions. An electrodeposition circuit is established comprising an anode, the electrolytic composition, the aforesaid cathode, and a power source. A potential is applied between the anode and the cathode during a via filling cycle to generate a cathodic electrodeposition current causing reduction of copper ions at the cathode, thereby plating copper onto the metallizing substrate at the bottom and sidewall of the via, the via preferentially plating on the bottom and lower sidewall to cause filling of the via from the bottom with copper. During the filling cycle, the polarity of circuit is reversed for an interval to generate an anodic potential at the metalizing substrate and desorb leveler from the copper surface within the via. Copper deposition is resumed by re-establishing the surface of the copper within the via as the cathode in the circuit, thereby yielding a copper filled via feature.

The invention is further directed to such a process wherein at least one anodic potential interval prevails to the extent of an average charge transfer of at least about $3 \times 10^{-4}$ coulombs/cm$^2$ integrated over the total electrodic area of said metalizing substrate.

The invention is further directed to such a process wherein the filling cycle comprises a plurality of faradaically material anodic potential intervals in each of which the average anodic charge transfer is at least about $3 \times 10^{-4}$ coulombs/cm$^2$ integrated over the total electrodic area of said metalizing substrate, and wherein, between successive faradaically material anodic potential intervals, the integrated average net forward current (cathodic) charge transfer over said the total surface area of the metalizing substrate is at least about $1 \times 10^{-2}$ coulombs/cm$^2$.

In another embodiment, the invention is directed to such a process wherein the ratio of cumulative charge transfer in the circuit during copper deposition within the filling cycle to the cumulative charge transfer during the sum of all anodic potential intervals being is at least about 50:1 and at least one anodic potential interval prevails to the extent of an average charge transfer of at least about $5 \times 10^{-5}$ coulombs/cm$^2$ integrated over the total electrodic area of said metalizing substrate.

Other features will be in part apparent and in part pointed out hereinafter.

DESCRIPTION OF PREFERRED EMBODIMENTS

Figure 1A:
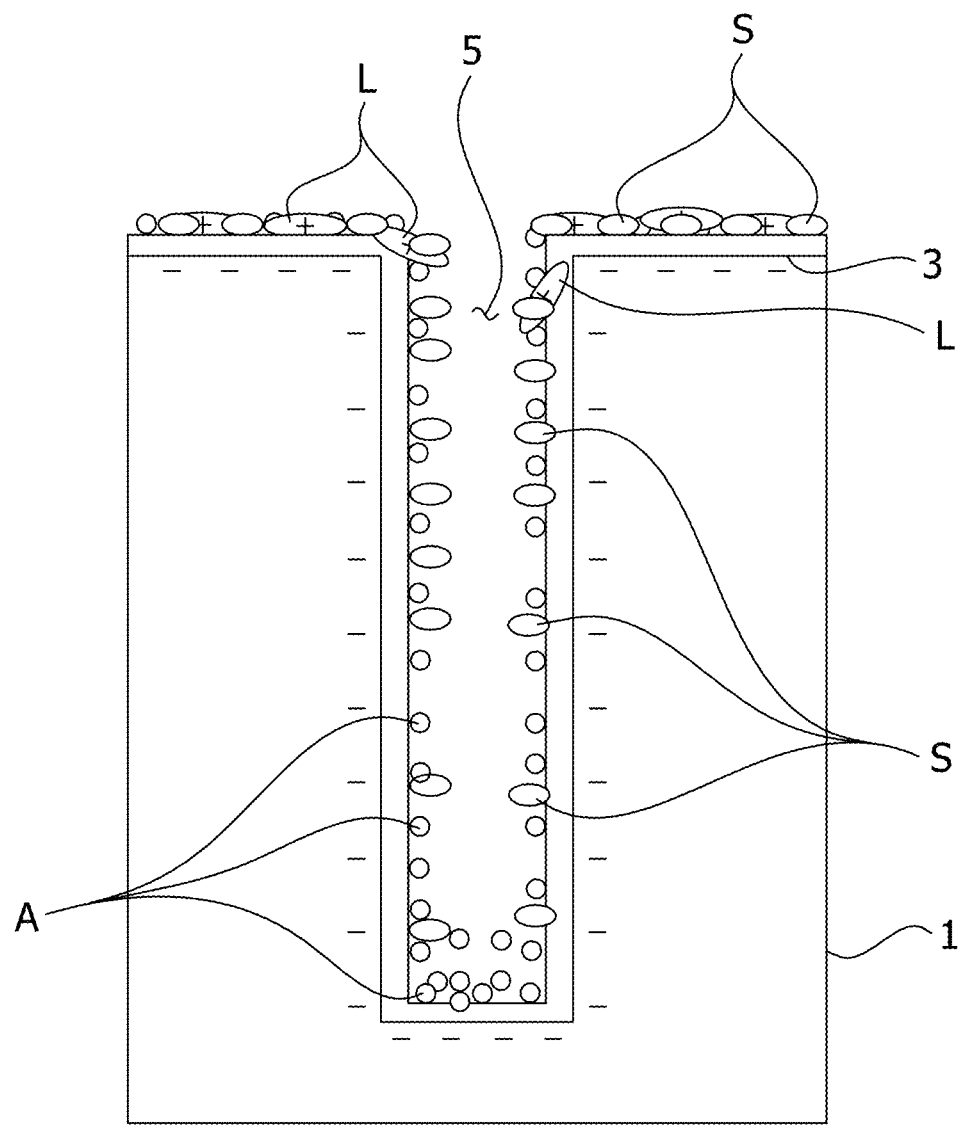
FIGS. 1A to 1D are schematic illustrations of the effect of diffusion on the mechanism of electrodeposition of copper onto the bottom and sidewall of a via from an electrolytic solution that contains copper ions, an accelerator, a suppressor and a leveler.

Schematically illustrated in FIGS. 1A to 1F is the mechanism of copper deposition onto a metalizing substrate that comprises the surface 3 of an integrated chip 1 having a via 5 in the surface. A seed layer is applied to the bottom and sidewall of the via and the exterior surface of the chip that together define the metalizing substrate. The seed layer is applied by conventional means such as physical or chemical vapor deposition. The chip comprising the metalizing substrate is immersed in an electrolytic composition that comprises copper ions, a counteranion for the copper ions, an acid, an accelerator, a suppressor, a leveler, and typically other electrolytic bath additives such as a chloride salt.

In the electrodeposition of copper onto metalizing substrate, the accelerator and suppressor, and leveler components of the electrolytic bath co-operate to promote bottom filling of the via. This effect is illustrated in FIGS. 1A to 1D.

Before immersion in the electrolytic plating bath, the integrated chip or other microelectronic device is preferably "pre-wet" with water or other solution in which the concentration of leveler and suppressor is generally lower than the concentration of these components in the electrolytic bath. Pre-wetting helps to avoid introducing entrained air bubbles when the device is immersed in the electrolytic bath. Pre-wetting may also be used to speed up gap fill. For this purpose, the pre-wet solution may contain a copper electrolyte, with or without additives. Alternatively, the solution can contain only the accelerator component, or a combination of all additives.

Preferably, the device is pre-wet with water, e.g., an aqueous medium devoid of functional concentrations of active components, most preferably deionized water. Thus, as the wetted device is immersed in the electrolytic bath, the water film remains as a diffusion layer (boundary layer) between the bulk electrolytic solution and the metalizing substrate on the field (exterior) of the device and within the via. For the electrolytic process to function, copper ions must diffuse from the bulk solution through the boundary layer to the metalizing substrate. Each other active component, in order to provide its function, must also diffuse through the boundary layer to the cathodic surface. Upon initial immersion, diffusion commences and is driven by the concentration gradient across the boundary layer. After potential is applied, copper ions and other positively charged components are also driven to the cathode by the electrical field. As the electrolytic process proceeds and components of the bulk plating bath are drawn into the boundary layer, the composition of the boundary layer changes, but a relatively quiescent boundary layer is always present as a barrier to mass transfer throughout the electrolytic process.

The accelerator is typically a relatively small organic molecule that functions as an electron transfer agent and which readily diffuses to and attaches itself to the metalizing substrate even in the absence of an applied potential. Copper ions, which are mobile and ordinarily present in the bath at substantially higher concentrations than other components, also diffuse readily through the boundary layer and contact the metalizing substrate. As a cathodic potential is applied to the metalizing substrate, diffusion of copper ions is accelerated under the influence of the electrical field. Initially, the concentrations of suppressor and leveler at the metalizing substrate and within the boundary layer remain relatively low, especially within the via. At surfaces on the exterior of the chip, mass transfer of suppressor and leveler through the boundary layer is promoted by convection and typically further promoted by agitation. But because the via is very small, the extent of convection and the effect of agitation is mitigated, so that transfer of suppressor and leveler to the copper surface within the via is retarded relative to the rate of mass transfer of these components to the metalizing substrate in the field or within the upper reaches of the via. In effect, the entire content of the via might be considered to constitute a boundary layer between the bulk solution outside the via entry and the interior wall (sidewall and bottom) of the via.

Figure 1B:
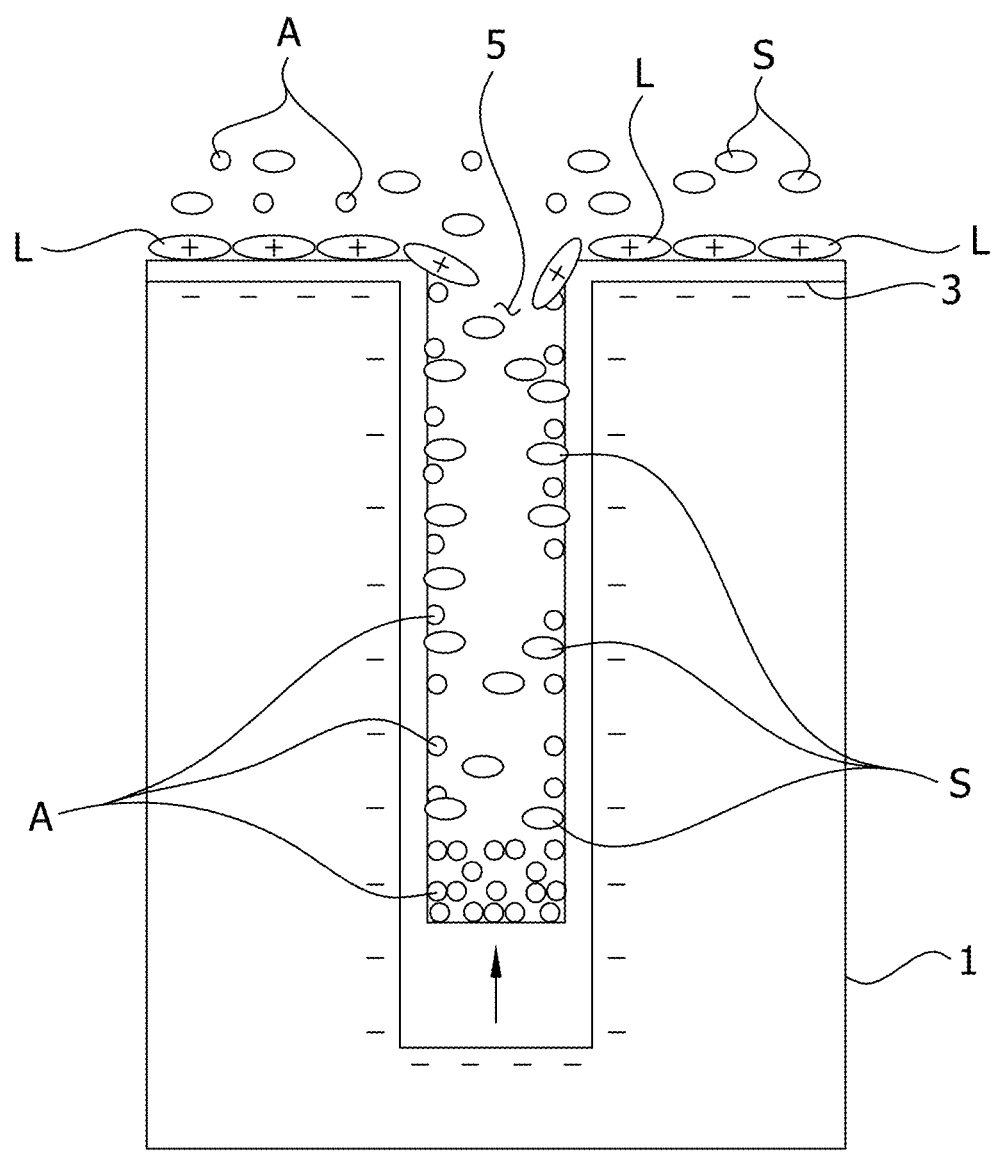

FIG. 1A illustrates the concentration profiles for accelerator, suppressor, and leveler in and above the via after a relatively short period of operation following application of cathodic current to the metalizing substrate. As illustrated, accelerator A rapidly diffuses from the exterior surface of the chip into the bottom of the via, thereby continuing to promote electrodeposition of copper at the bottom and along the lower sidewall of the via. Chloride ions also diffuse into the boundary layer despite the retarding effect of the electrical field which draws copper ions toward the cathode. The suppressor S is a relatively larger molecule which moderately retards charge transfer and inhibits copper deposition, thus tending to require a relatively more negative potential for copper deposition. Because of its relative size, the suppressor diffuses into the via more slowly than the accelerator, resulting in a suppressor concentration gradient in which the suppressor concentration in the boundary layer at the metalizing substrate decreases with depth in the via. These effects are illustrated both in FIG. 1A and FIG. 1B. FIG. 1A depicts the concentration patterns shortly after the startup phase wherein cathodic current has been applied at a relatively low density to promote the plating of a thicker conformal coating over the seed deposit in order to increase the conductivity at the metalizing layer, while FIG. 1B represents the profile of the via as bottom filling progresses. Resulting from and inverse to the suppressor concentration gradient is an electrodeposition potential gradient in which the negative electrodeposition potential required for copper deposition decreases with depth within the via, i.e., the electrodeposition potential becomes more positive as distance from via entry increases. Thus, at the applied potential, the driving force for copper deposition increases with depth, causing the deposition rate to be highest at the bottom and to progressively decrease as the depth decreases. Preferably, the total electrolytic current is maintained at a constant level even as the resistance increases along the conduction paths to the field and the upper reaches of the via due to sorption of leveler and suppressor at these surfaces. Since this leaves the conduction path to the bottom of the via as the path of least resistance, deposition of copper in the bottom of the via is promoted relative to deposition at the top or on the field. This promotes orderly filling of the via from the bottom to the top without formation of seams or voids. Moreover, because the total current flow in the circuit is maintained constant during any defined period of operation, the current density at the bottom of the via, and the consequent filling rate, are actually increased as operation proceeds and leveler occlusion increases at the surfaces of the field and upper portions of the via.

As described in U.S. Pat. No. 7,670,950, incorporated herein by reference, the deposition potential is also substantially influenced by the degree of agitation, and more particularly by the extent of turbulence or relative flow at the substrate surface. Higher turbulence at, and/or relative flow along, the substrate has the effect of requiring a more negative electrodeposition potential for deposition of copper. Thus, at the surfaces that are influenced by agitation, agitation suppresses the copper electrodeposition rate by promoting adsorption of leveler and/or a suppressor from an electrolytic bath containing these components. While turbulence and relative flow tend to increase the mass transfer coefficients across the boundary layer for all active components of the electrolytic solution, agitation has a disproportionate effect on the otherwise slow mass transfer of suppressor and leveler relative to the comparatively rapid transfer of copper ions and accelerator, i.e., agitation tends to promote mass transfer of suppressor and leveler to a greater extent than copper ions and accelerator because the copper ions and accelerator are small in size and diffuse relatively rapidly under the influence of the electrical field even in the absence of turbulence. In most commercial electrolytic baths, copper ions are also present in substantially higher concentrations than other components of the solution, which further contributes to the availability of copper ions for electrodeposition irrespective of agitation. As a consequence, agitation of the electrolytic bath can enhance the selectivity of electrodeposition to the bottom of the via.

Thus, where the electrolytic bath is agitated, the highest turbulence or relative flow is on the substrate along the surface of the integrated circuit device, with the degree of turbulence decreasing with depth in the via. As a consequence of this gradient of decreasing turbulence, agitation increases the slope of the electrodeposition potential gradient from the top to the bottom of the via, reinforcing the effect of the relative diffusivities of copper ions and accelerator vs. suppressor and leveler in directing the deposition process to begin at the bottom of a via and to progress upwardly in an orderly manner until the via is filled.

Expressed in another way, the accelerated mass transfer of leveler and suppressor to the cathodic surface along face of the field and the upper regions of the via relative to the bottom of the via, as induced by agitation, enhances the differential in conductivity between the electrical path from anode to the bottom of via vs. the electrical paths to the field and the upper regions of the via. In other words, agitation enhances selectivity toward bottom filling. Moreover, under the constant current condition that is preferably maintained during any given phase of the deposition process, enhanced selectivity also contributes to an increase in the absolute current density at the bottom of the via, not merely to an increase relative to the current density in the other regions.

Referring again to FIGS. 1A and 1B, the leveler L is a very large molecule that bears a strong positive charge. Typical leveler molecules have a molecular weight in the range of about 100 g/mol to about 500,000 g/mol, for example. Because of its size, the leveler diffuses very slowly, significantly more slowly than the suppressor S. Its slow diffusion rate coupled with its strong charge cause the leveler to concentrate at the areas of the metalizing substrate at the surface of the integrated circuit chip and the very top reaches of the via. Where the leveler attaches to the substrate, it is not readily displaced by either the accelerator A or the suppressor S. In essence, the system is driven toward a phase equilbrium between the electrolytic solution and the metalizing surface in which relative concentration of leveler is much higher than accelerator or suppressor at the surface. As a further consequence of its size and charge, the leveler exhibits a strongly suppressive effect on electrodeposition, requiring an even more negative electrodeposition potential than that required by the presence of the suppressor. As long as the leveler is concentrated at the exterior surface (the field) of the chip (or other microelectronic device) and the upper reaches of the via, it is effective to retard electrodeposition on those surfaces, thereby minimizing undesirable overburden and preventing pinching and formation of voids at or near the via entry. Too high a concentration of leveler in the via can substantially retard bottom up capability by redirecting the current path of least resistance and thus increasing the plating rate on the field relative to the bottom of the via and thus compromising the desired bottom-up filling.

Figure 1C:
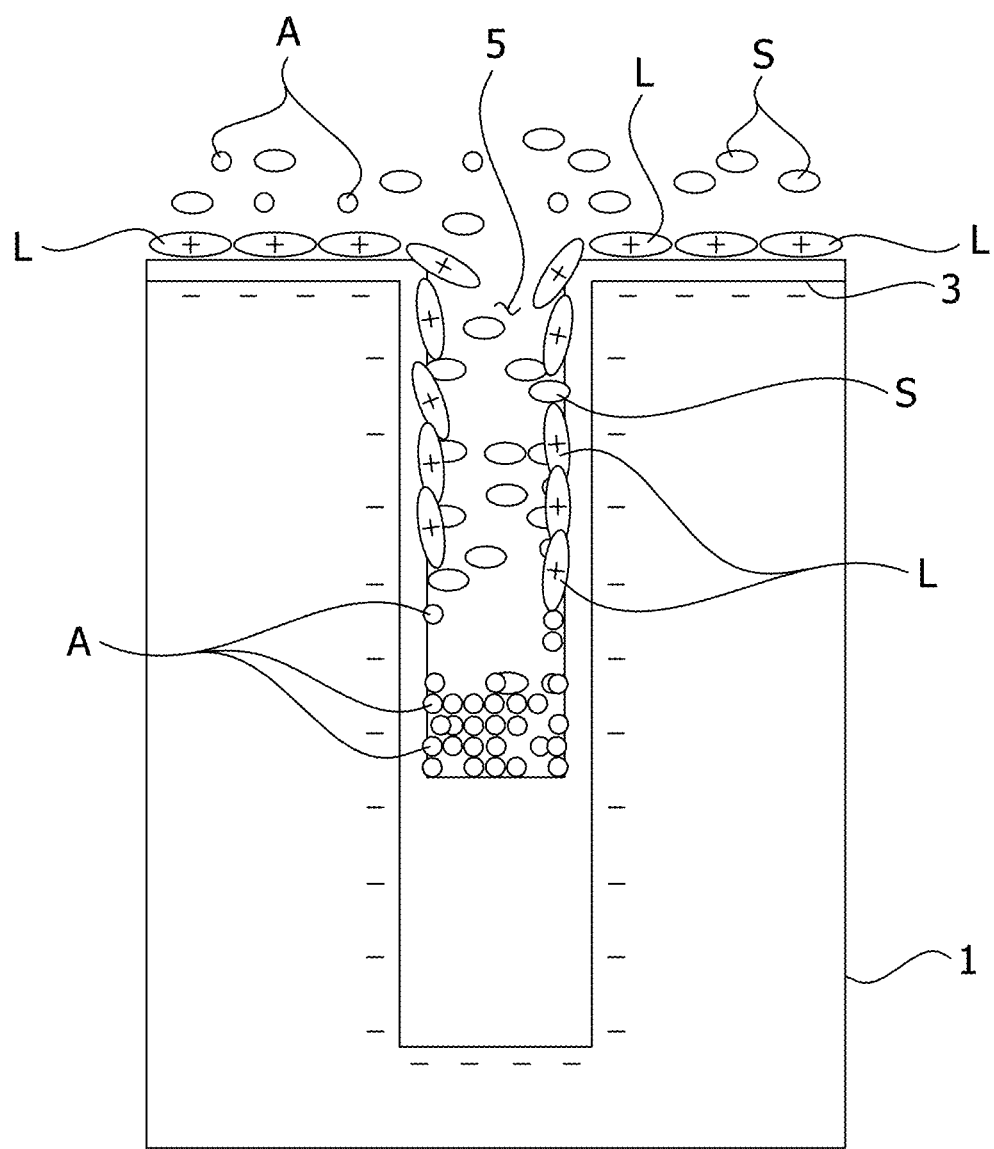
Figure 1D:
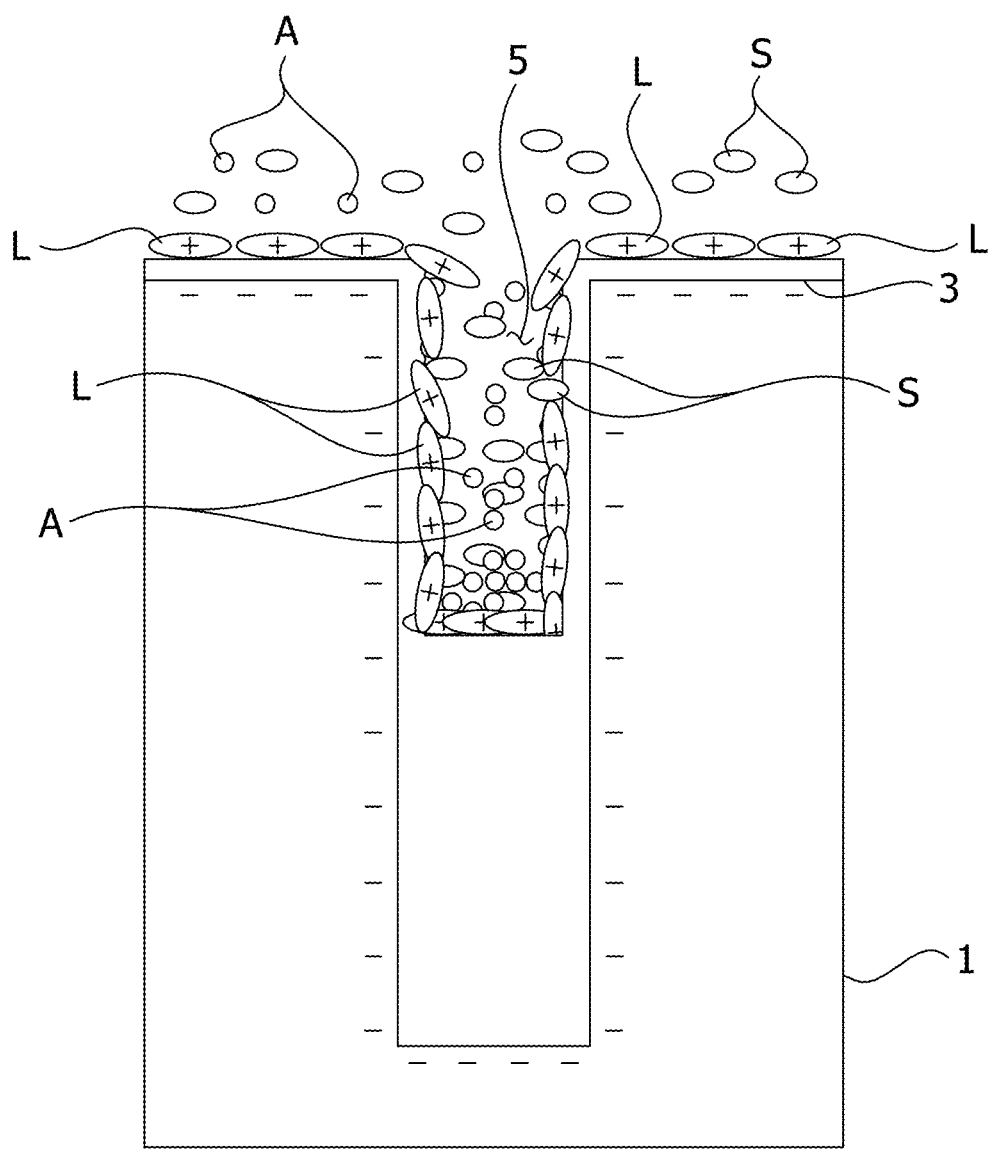

When electrodeposition is initiated, the leveler L does not immediately reach a significant concentration in the boundary layer. Under the influence of convection and agitation, it is fairly readily drawn to the metalizing surface of the field, but does not immediately penetrate the via to any significant extent. However, as the filling cycle progresses, the slow-diffusing leveler eventually works its way into the upper reaches of the via. Since the via is preferentially filling from the bottom, the presence of leveler near the top of the via does not present an obstacle to the bottom-filling process; and at constant current in the electrolytic circuit, adsorption of the leveler to the upper regions of the via redirects current to the bottom of the via thereby actually accelerating the filling rate at the bottom. As the via progressively fills with copper, the leveler continues to diffuse down the via. At locations where the leveler attaches to the via sidewall and bottom up copper surface, a distinctly more negative electrodeposition potential becomes required for copper deposition. As electrodeposition proceeds, the filling level (i.e., the copper filling front) and the location to which the leveler front has diffused progressively approach each other, as shown in FIG. 1C. As the filling level and leveler front come into close proximity, and especially as the leveler adsorbs to a significant extent onto the upper surface of the copper filling the via (see FIG. 1D), the inevitable result is a sharp decrease in the bottom up speed, with current being redirected to the field, with the further adverse effect of increasing copper overburden. As a result, a distinctly higher applied potential is thereafter required to drive the process forward, and under these circumstances the copper deposition pattern resulting from forcing the current is not favorable. At a given applied potential, the bottom up deposition rate significantly declines and copper deposition is redirected to the top surface, extending the deposition cycle and starkly reducing the productivity of the via filling process. Diffusion of leveler into the via retards the bottom up process to the extent that it may take two hours or more to complete filling of the via with copper, and thus increases the overburden.

Figure 1E:
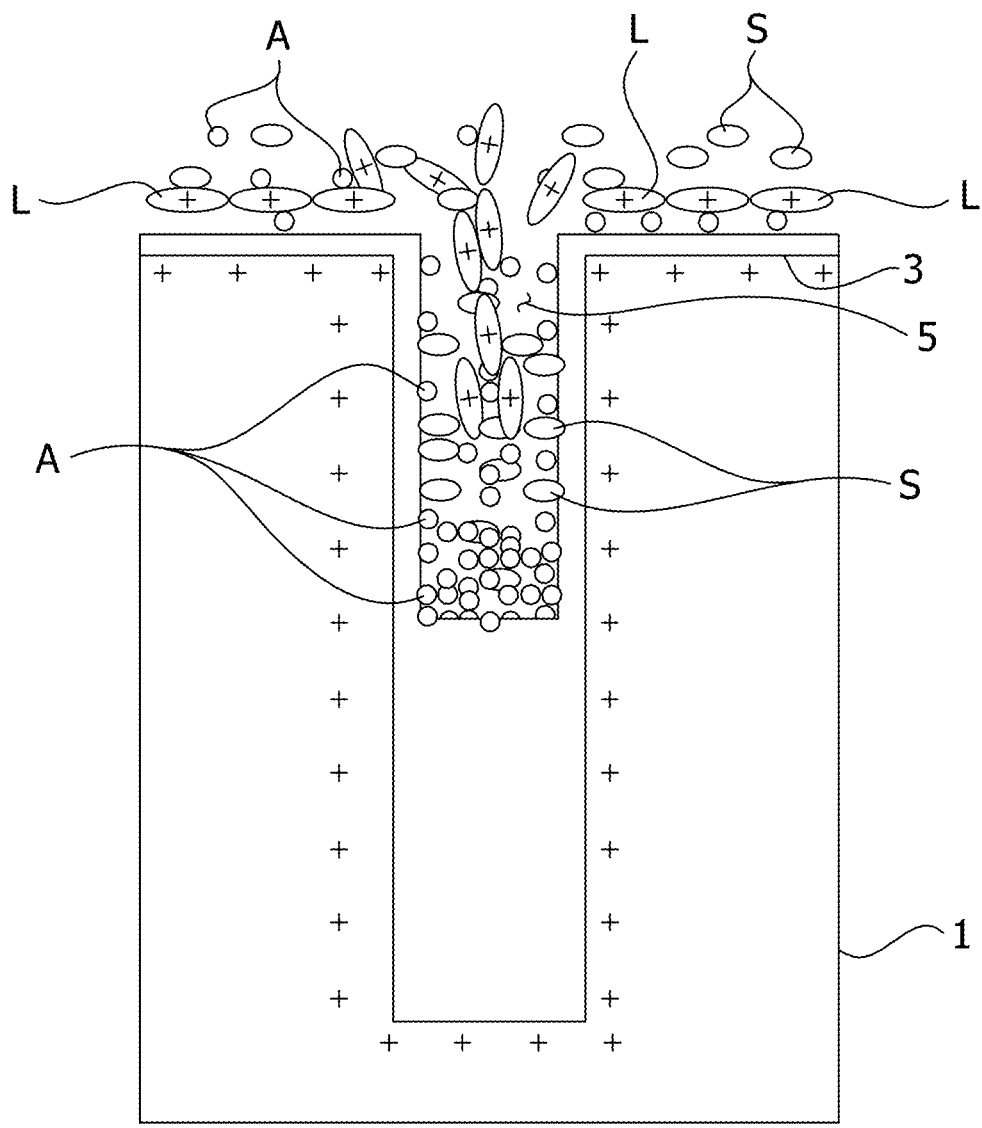
FIGS. 1E and 1F show the effect of an interval of anodic potential at the metalizing surface in restoring satisfactory electrodeposition rates in bottom filling of a via after leveler diffusion has significantly inhibited bottom up electrodeposition.
Figure 1F:
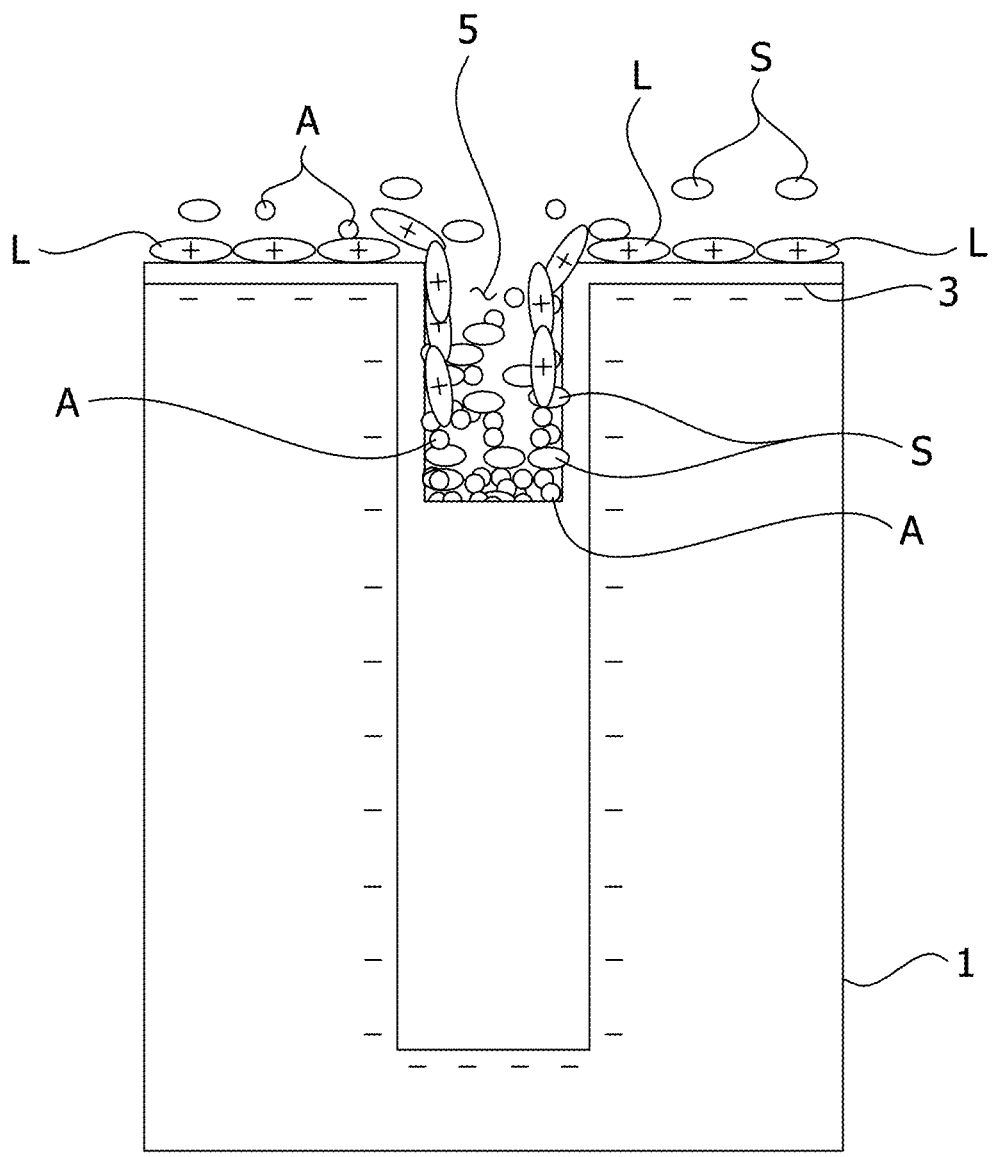

In accordance with the invention, it has been discovered that the adverse effect of leveler diffusion may be resolved by interrupting forward current flow during the filling cycle by one or more intervals of anodic potential at the metalizing substrate resulting in anodic desorption of the leveler and most probably the suppressor as shown in FIG. 1E. The anodic potential intervals are sufficient in duration and charge transfer density to inhibit incipient adsorption of leveler to the copper surface within the lower regions of the via and thereby maintain a satisfactory filling rate, and/or to desorb leveler that has attached to the metalizing substrate, thereby restoring access to the substrate of copper ions and adjuvants that promote copper deposition (e.g., Cl$^-$ and accelerator), and restoring the filling rate to a satisfactory target value. Desorption of leveler (and suppressor) under the influence of an anodic potential interval is schematically illustrated in FIG. 1E. By application of the process of the invention, it has been discovered that plating of chips, IC substrates, PWBs and other microelectronic devices, including filling of vias, can be conducted at a consistently relatively rapid electrodeposition rate, equating to high productivity in a semiconductor electronic circuit manufacturing process. FIG. 1F is a schematic showing desorption during a reverse current interval subsequent to the anodic potential interval illustrated in FIG. 1E. FIG. 1F shows that seamless and void-free bottom filling has progressed to a substantial extent beyond the level achieved in FIG. 1E. Recurrent anodic potential intervals maintain a satisfactory electrodeposition rate and assure the via is entirely filled.

Figure 2:
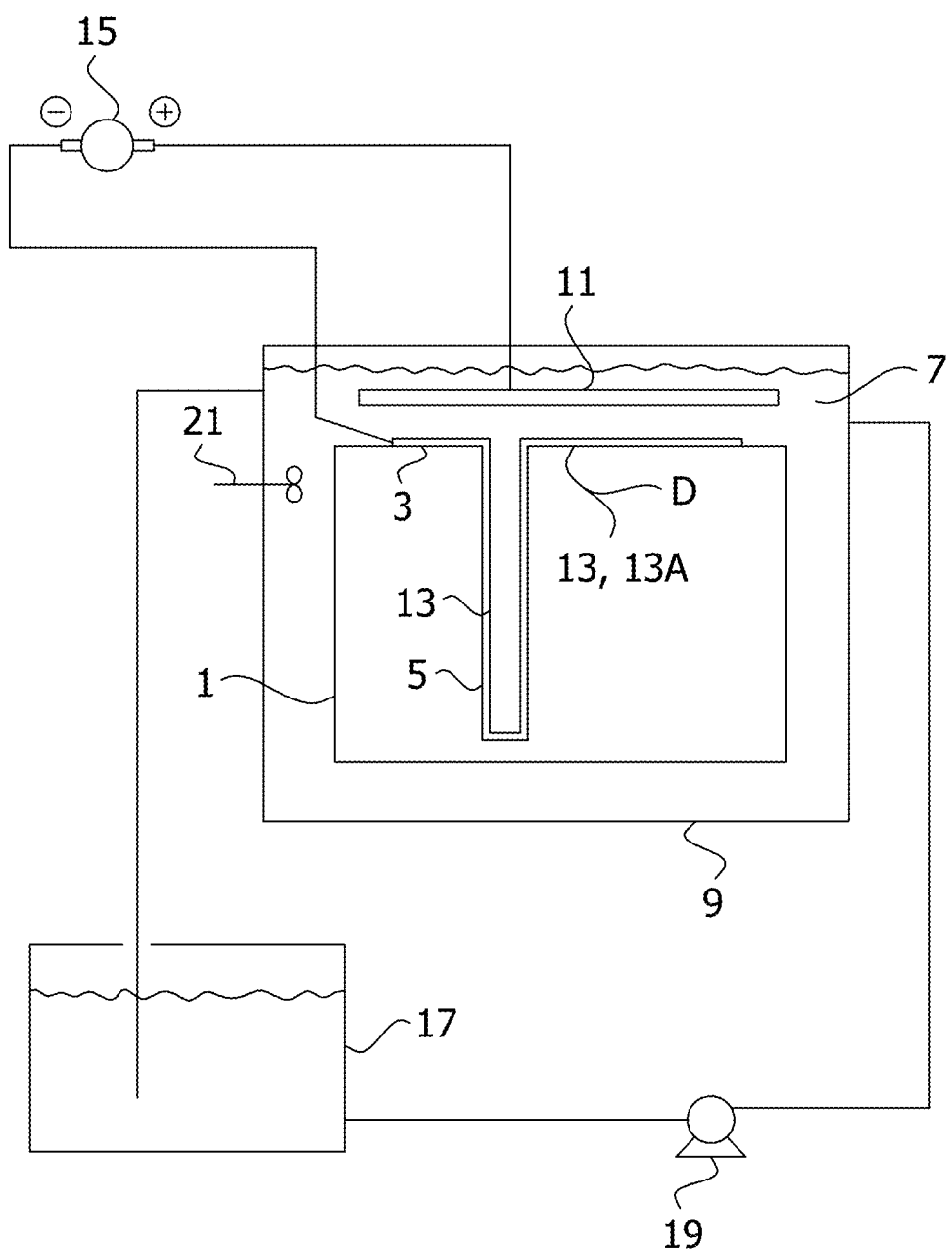
FIG. 2 is a schematic illustration of an apparatus and process for copper plating of through silicon vias according to the instant invention.

FIG. 2 is a schematic illustration of a process for filling vias. A pre-wet wafer 1 is immersed in an aqueous electrolytic solution 7 contained within a cell 9. The wafer 1 here is illustrated as having only a single via for simplicity; in actual practice the wafer has a diameter of, e.g., 4-5", 200 mm or 300 mm, and hundreds of vias and trenches. The electrolytic solution comprises copper ions, a counteranion for the copper ions, chloride ions, an acid, an accelerator, a suppressor, and a leveler. Optionally, the electrolytic solution further comprises other additives such as a chloride ion, other halides such as bromides, and wetting agents. Electrolytic solution 7 is also in contact with an anode 11 immersed in the solution. As noted, wafer 1 comprises a surface 3 containing a via 5. A seed layer 13 is deposited at the bottom and along the sidewall of via 5, and over a designated area D of surface 3 of the wafer. An electrolytic circuit is established as electrolysis proceeds comprising anode 11, solution 7, a power source 15, and a metalizing surface which is copper that is deposited as the seed layer 13 and 13A. During the course of forward current flow, copper of the seed layer and electrolytic copper deposited onto the seed layer function as a cathode in the electrolytic circuit. Optionally, a cell divider membrane (not shown) may be interposed between the anode and the metalizing substrate which functions as the cathode.

To facilitate bottom filling of the via, the electrolytic bath in which pre-wet wafer 1 is immersed is agitated, e.g., by circulating the electrolytic solution between cell 9 and an electrolytic solution supply vessel 17 via a circulating pump 19, or alternatively or additionally by the effect of a mechanical agitator 21. On application of a sufficient direct current potential from power source 15, copper is deposited from the electrolytic solution onto the metalizing substrate. Due to the electrodeposition potential gradient in the via as arising from the suppressor and leveler concentrations gradient that develop as a result of the differential between the diffusion rates of accelerator and suppressor, and sharpened by the effect of agitation, via 5 fills preferentially from the bottom.

During the filling cycle, in accordance with this invention, the polarity of the power source is reversed to establish an anodic potential at the metalizing substrate during at least a small plurality such as two to five intervals, in order to desorb and significantly repel leveler and/or suppressor that may have diffused into the via, which tends to raise the requisite negative electrodeposition potential, and retard the rate of deposition. An anodic potential is maintained for a period that is effective to desorb and significantly repel leveler and or suppressor, arrest and/or reverse the increase in required electrodeposition potential, preferably to maintain and/or restore a favorable rate of electrodeposition without appreciable dissolution of copper from the sides of the via, and most preferably to redirect the current distribution so that the current density at the bottom of the via is increased relative to the current density over the field and upper reaches of the via. During the anodic interval, the positively charged leveler and/or suppressor molecules are driven off and repelled a significant distance from the now positively charged electrodic surface of the metalizing substrate, preferably to an extent sufficient that, when cathodic current is resumed, the concentrations of leveler and suppressor at the metal surface and in the boundary layer do not immediately return to the levels prevailing just prior to the anodic interval, and a more favorable distribution of current density prevails for a reasonable time after the end of the anodic pulse. For example, for a period of at least 30 seconds, preferably at least 60 seconds after the anodic interval, the proportion of total current distributed to the bottom of the via may exceed the proportion of current distributed to this location during the cathodic interlude just prior to the anodic interval; and the absolute current density at the bottom is typically also increased for at least a similar period as compared to the bottom current density just prior to the anodic interval.

The effect of the anodic potential can be equated to "magnetic repulsion." The favorable redirection of current may also be associated with a decrease in the circuit potential required to maintain a constant total circuit current density, or with a higher overall circuit current density at constant potential, and these effects may also be measurable and persist over a comparable period of time. But the purpose of the anodic interval is primarily the redirection of current density rather than a reduction in overall impedance of the circuit which includes resistive elements other than boundary layers and leveler occlusion of the metallizing substrate.

After each anodic potential interval, the normal polarity of the power source is re-established so that the metalizing substrate functions once more as a cathode and the electrodeposition resumes at a restored or enhanced rate. If the anodic potential interval is sufficient in duration and charge transfer density, forward current is not only restored but preserved at a reasonably productive level for a significant interlude before any further anodic potential interval becomes necessary or desirable.

It should be recognized that the copper deposition process in filling through-silicon via is a leveler driven process. Thus, some amount of leveler is necessary for successful gap fill. However, an over-abundance or accumulation of leveler in the bottom of the via, or at the metallic copper front as the copper deposit grows upwardly from the bottom, may be detrimental in successful TSV fill.

More than a short millisecond range anodic pulse is necessary to achieve the desired leveler depolarization and repulsion of the metalizing substrate for further function as a cathode when the polarity of the power source is returned to its normal orientation for deposition of copper. Thus, the anodic potential intervals contemplated by the process of the invention differ sharply from the reverse pulses that were known to the art in conventional pulse current electrodeposition processes. The mode of operation and efficiency of an electrodeposition process requires sufficient time and charge transfer to desorb and appreciably repel the large highly charged leveler molecules which otherwise severely retard the copper deposition rates. The duration of the anodic potential interval is also preferably sufficient to desorb and significantly repel the suppressor which, unlike the leveler, does not acquire an unbalanced positive charge, but which is polarizable under the influence of the electrical field. The brief though frequent reverse pulses that are conventionally applied to deal with concentration polarization at anode or cathode in the prior art have not been found as effective for removal and significant repulsion of adsorbed leveler. Although the brief pulses of the conventional processes may be sufficient for transient disruption of the physisorptive and/or electrostatic attachment of the leveler (and/or suppressor) molecules to the copper surface, such brief pulses are generally not sufficient to prevent instantaneous resorption at the end of the pulse, or to restore the differential current density condition favoring selective and rapid bottom filling that is achievable using the process of the invention. Aside from duration, the anodic intervals of the instant process differ from the pulses of the conventional reverse pulse processes with respect to frequency, regularity (periodicity), and relationship to forward (cathodic) current flow as expressed in terms of either duration or charge transfer.

Typically, prior art reverse pulse processes have been devised to prevent polarization of the anode due to release of oxygen or other gases produced by oxidation of anions within the electrolytic solution, and/or to prevent or reverse concentration polarization of the cathode. As is known in the art, the anode may optionally be constituted of a material which is soluble in the electrolytic solution under electrolysis conditions; e.g., a copper anode may be used which is oxidized during electrolysis to furnish copper ions that are deposited on the metalizing substrate which supplies electrons to the solution during forward current operations. However, because a soluble anode is consumed in the electrolytic process, its dimensions change, its area typically diminishes, and its ability to sustain the electrolytic current deteriorates.

In many applications, it is preferred to use an anode constituted of a material, or at least coated with a material, which is insoluble under the electrolytic current conditions. Such an anode is dimensionally stable and preserves a predictable capacity for supplying and conducting current, and for maintaining stable electrical field lines, during the plating and via filling cycle. However, a drawback of dimensionally stable anodes is the tendency to polarize due to release of gases, most typically oxygen, in the course of the oxidation reaction that necessarily takes place at the anode to balance the reduction reaction occurring at the cathode. As described, e.g., in references such as Meyer et al. U.S. Pat. No. 6,793,795, very brief and regular reverse pulses help to prevent gas accumulation and polarization of the anode.

As discussed above, the brief, periodic and frequent reverse pulses of the prior art are also effective to deal with concentration polarization at the cathode by maintaining or restoring the concentration of metal ions and adjuvants in the boundary layer.

While effective to limit or prevent polarization at the anode, brief and regular pulses as described in Meyer et al. and similar references have not been found effective for depolarizing a cathode at which the electrodeposition potential has been adversely affected by the diffusion and adsorption of a high molecular weight, highly charged leveler. In order to reliably achieve the result provided by the process of the invention, it has now been found that the anodic potential intervals must be significantly longer (one, two, or more orders of magnitude longer) than the typically millisecond duration of the reverse pulses in a conventional reverse pulse process. Moreover, it has further been discovered that, for desorption of leveler to depolarize a cathode that has been polarized by excess leveler occlusion, the requisite number of anodic potential intervals is many times fewer than the number of reverse pulses that are imposed on the waveform in order to depolarize the anode according to processes such as that described by Meyer et al.

The number of anodic intervals imposed is variable within a wide range. In order to minimize any sacrifice in power efficiency, it is generally preferred to implement no more anodic intervals than necessary; but for any system, overall excellent productivity can be achieved by particular combinations of the number and duration of anodic intervals. Thus, a schedule of relatively frequent anodic intervals may tend to maximize the average forward (cathodic) current density during the cathodic interludes, especially the current density in the bottom of the vias to which the current is preferable directed by the effect of the anodic intervals, while a lesser number of anodic intervals tends to increase the proportion of time in which cathodic current prevails, and thus maximize cumulative duration of cathodic current over any given electrolytic plating cycle. For any given circuit, the number, duration and frequency of anodic intervals are subject to sui generis (system specific) optimization.

Typically, it has been found that from only one to up to hundreds, such as one to ten, anodic potential intervals are sufficient. For example, it has been found that as few as one to five, or even one to three anodic potential intervals can be sufficient. However, in other systems a greater number may be preferred. Experienced operators can readily arrive at a schedule which achieves the salutary benefits of the process of the invention. In any case, there do not appear to be any barriers to using several tens or even several hundreds of such anodic intervals, which in fact in some applications may prove tolerable or even efficacious. But because anodic intervals represent a brief interruption in the forward deposition of metal, there does not appear to be technical motivation to use more anodic intervals or longer anodic intervals than are required to achieve the desired desorption and repulsion. More intervals and longer intervals and even cumulatively higher current transfer intervals may at some point result in the undesirable dissolution of dissolved copper. The process can proceed satisfactorily with substantial interludes of forward current operation between successive anodic potential intervals.

In a process in which the forward current flow is, e.g., in the range of 0.01 to 100 mA/cm$^2$, preferably 0.25 to 10 mA/cm$^2$, the anodic current during the anodic potential intervals is preferably in the range of only 0.1 to 10 mA/cm$^2$, preferably 0.2 to 1.0 mA/cm$^2$. Higher anodic current densities can be tolerated but may not be necessary. If the anodic current density is greater than necessary, or the anodic potential interval longer than necessary, unwanted dissolution of copper and/or seed layer ensue, with consequent extension of the filling cycle and/or void formation. Limited dissolution of copper during an anodic potential interval can be acceptable, but not preferred, and not necessary to achieve the desired extent of leveler desorption.

In accordance with the invention, it has been found that each anodic potential interval should have a duration of at least about 0.01 seconds, more normally at least about 0.1 second, such as at least about 0.5 seconds or at least about 2 seconds and not greater than about 100 seconds, most preferably not greater than about 30 seconds, e.g., in the range of between about 0.1 and about 100 seconds, between 0.5 and about 100 seconds, between 1 and about 100 seconds, between about 0.1 and about 30 seconds, between about 0.5 and about 30 seconds, or between about 2 and about 30 seconds. Conveniently and advantageously, the length of an individual anodic potential interval in some embodiments is between about 2 and about 10 seconds, providing an average anodic current charge transfer density of at least about $5\times10^{-5}$ coulombs/cm$^2$, preferably between about $3\times10^{-4}$ and about 0.3 coulombs/cm$^2$ integrated over the total electrodic area of the metalizing surface.

Very little sacrifice in power efficiency is suffered from the anodic current intervals provided in the process of the invention. There is seldom a need for an anodic current interval longer than about 15 seconds, and none of the anodic current intervals need prevail to the extent of an average charge transfer density greater than about 0.3 coulombs/cm$^2$ integrated over the total electrodic area of said metalizing substrate. By way of further example, the relative infrequency and modest duration of the anodic current intervals translates into a ratio of cumulative charge transfer density in the electrolytic circuit during copper deposition within the cathodic via filling cycle to the cumulative charge transfer density during the sum of all intervals of anodic current during the cycle that is at least about 50:1, more preferably at least about 80:1, still more preferably at least about 100:1, most preferably at least about 300:1, or even greater than about 1000:1. The typical charge transfer density ratio is between about 500:1 and about 100,000:1, preferably between about 1,000:1 and about 50,000:1, most typically between about 3,000:1 and about 30,000:1.

Similarly, the ratio of cumulative forward (cathodic) current duration to anodic current duration within the filling cycle is preferably at least about 30:1, more preferably at least about 80:1, still more preferably at least about 150:1, and most preferably at least about 200:1. The typical time duration ratio is between about 30:1 and about 500:1, more preferably between about 80:1 and about 300:1, most typically between about 150:1 and 300:1.

Expressed in other terms, the cumulative duration of all anodic current intervals during the filling cycle in certain embodiments is not more than about 50 seconds, and/or the maximum cumulative extent of anodic charge transfer density in the electrolytic circuit in the sum of all intervals of anodic is not greater than an average of about 1.8 coulombs/cm$^2$ integrated over the total electrodic area of the metalizing substrate.

Since only one to fifty, for example, one to twenty, anodic current intervals are required, relatively extended forward (cathodic) current interludes can be maintained between successive anodic current intervals. But the extent of such forward current interludes can more precisely be characterized by recognizing that the process of the present invention is not exclusive of the alternating pulse waveforms that are known to the art to prevent polarization at a dimensionally stable anode and/or concentration polarization at the cathode. In such embodiments, a regular pattern of very short reverse current pulses for anode depolarization can overlay the forward current interludes between those anodic current intervals that are of an amplitude and duration sufficient for desorption of leveler and reversal of the depolarizing effect of leveler occlusion of the cathode.

For clarity, it is therefore useful to define an anodic current interval of "material duration" as an anodic interval having a duration of preferably at least 0.6 seconds and/or at least three times, preferably at least five times, typically at least 10× or at least 100× the weighted average duration of the pulses which overlay the alternation between cathodic interludes and anodic intervals for desorption of leveler and/or suppressor according to the process of the invention. Regardless of whether the forward current interludes are overlaid with shorter reverse pulses, the process in certain embodiments comprises at least one, typically one to ten, more typically one to five, most typically one to three anodic current intervals of material duration. More preferably, the process comprises a plurality, i.e., at least one anodic current intervals of material duration. In accordance with the invention, the period or interlude of forward current between successive anodic current intervals of material duration is preferably at least about 5 seconds, more preferably at least about 30 seconds. However, the anodic current intervals of proper duration, as discussed above, make it feasible and advantageous to maintain the forward current interludes between successive material anodic current intervals for periods much longer than 5 to 30 seconds. For example, the forward current interludes extend for periods of at least 0.5 minutes, such as between about 5 and about 20 minutes between successive anodic current intervals of material duration.

Similarly, a "faradaically material" anodic current interval may be defined as such interval during which the average anodic current charge transfer density is at least about $5 \times 10^{-5}$ coulombs/cm$^2$ integrated over the total electrodic area of the metalizing substrate and/or at least three times, preferably at least five times, typically at least 10× or at least 100× the weighted average current charge transfer density of the pulses which overlay the alternation between cathodic interludes and anodic intervals for desorption of leveler and/or suppressor according to the process of the invention. Regardless of whether the forward current interludes are overlaid with shorter reverse current pulses, the process preferably comprises a plurality, i.e., at least two faradaically material anodic current intervals. In accordance with the invention, the integrated average net forward current charge transfer density over the total surface area of the cathode between successive faradaically material anodic current intervals is in these embodiments preferably at least about $1 \times 10^{-2}$ coulombs/cm$^2$, most typically between about $3 \times 10^{-2}$ and about 0.3 coulombs/cm$^2$.

Although the duration of the anodic current intervals is orders of magnitude longer than the reverse current pulse in a conventional alternating pulse process, the anodic current density applied in the process of the invention need not be excessive. Unlike the conventional alternating pulse processes in which the reverse current pulse is typically at a current density significantly higher than the density of the forward pulse, the current density during the anodic current intervals of the process of the invention can be no greater than, typically significantly less than, the current density during the forward current interludes that are applied toward the completion of the filling cycle. For example, during an interval of anodic current of material duration or an interval of faradaically material anodic current, the current density in the electrolytic circuit in these embodiments is preferably maintained at an average of less than about 100 mA/cm$^2$, more preferably less than about 20 mA/cm$^2$, most typically between about 10 and about 0.1 mA/cm$^2$, integrated over the total electrodic area of the metalizing substrate.

Despite the favorable effect of electrolytic bath agitation on the electrodeposition potential profile of the via and consequent selectivity in deposition, diffusion and adsorption of leveler on the via sidewall and copper at the bottom up boundary can cause the processes of the prior art to require more than 90 minutes, often 2 hours or longer to achieve satisfactory filling of the via. In accordance with the invention, the via can be 90% filled, preferably 100% filled, within a filling cycle of 90 minutes or shorter, preferably less than about 75 minutes, advantageously no more than about 60-10 minutes.

Cumulative charge transfer density during the anodic current intervals should be at least about $5 \times 10^{-5}$ coulombs/cm$^2$-hr during a period extending from first application of potential to the circuit until the via is at least about 90% filled. However, the cumulative charge during these intervals in certain embodiments does not need to exceed $3 \times 10^{-4}$ coulombs/cm$^2$-hr and is more typically less than about 0.3 coulombs/cm$^2$-hr. As used herein, the term "% filled" relates to the volume of void free copper in the via relative to the original volume of the via.

Comparative Example 1

An integrated circuit chip having closely spaced 8μ×100μ (aspect ratio=10.6) was seeded and copper plated using a plating solution containing Cu sulfate (40 to 50 g/L copper ion), sulfuric acid (20-80 g/L), 3,3'-dithiobis sodium salt of the compound of Formula IA in U.S. Pat. No. 6,776,893 (3 ml/L), a leveler comprising a polymer prepared by reacting 4,4'-ethylenedipyridine and an alkylating agent comprising 1-chloro-2-(2-chloroethoxy)ethane and corresponding to Formula VIII in US 2010/0126872 (8 ml/L) and a polypropylene glycol having a molecular weight of about 700 g/mol (2 ml/L) and chloride ions (50 ppm). U.S. Pat. No. 6,773,893 and US 2010/0126872 are expressly incorporated herein by reference.

Figure 3A:
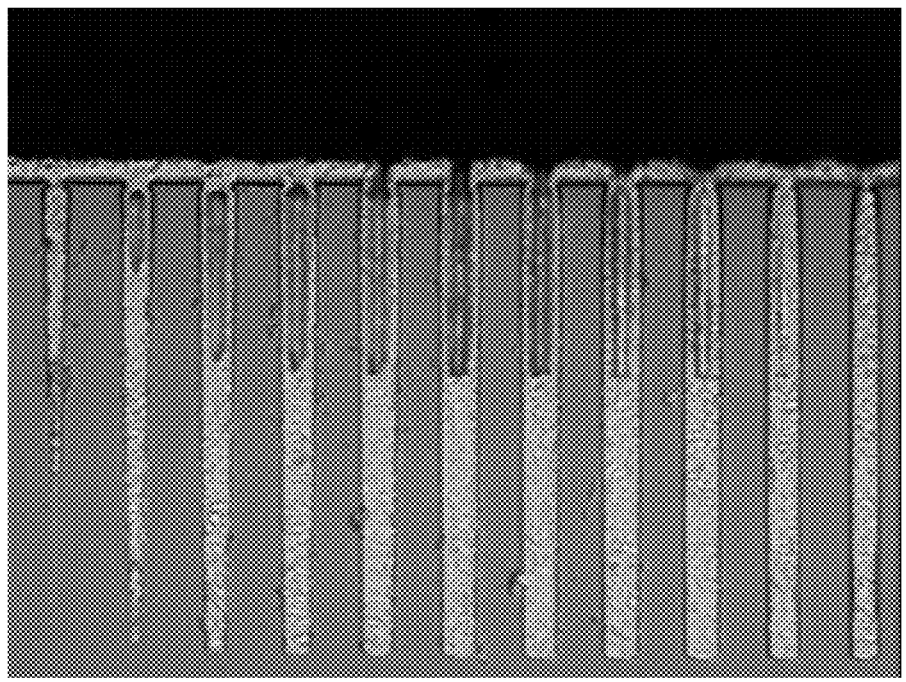
FIG. 3A is a photomicrograph of a section of an integrated chip showing vias filled by a plating process according to a comparative process that does not include the anodic potential intervals of the process of the invention.

The chip was vacuum degassed, pre-wet with deionized water, and placed face down in the electrolytic bath at 50 rpm. The DC current schedule was 0.5 mA/cm$^2$ for 15 minutes, followed by 1 mA/cm$^2$ for 60 minutes and 1.5 mA/cm$^2$ for an additional 60 minutes. FIG. 3A is a photomicrograph of a section of the chip that had been plated over a period of 135 minutes in accordance with the process of this example. As shown in the FIG. 3A, after 135 minutes of plating, the vias were only about 60% filled.

Example 1

Using the same plating solution, sample preparation and plating method as Comparative Example 1, an integrated circuit chip identical to that plated in Comparative Example 1 was plated according to the following schedule:

| | |
|---|---|
| −0.5 mA/cm$^2$ × 2 minutes | (cathodic) |
| −1.0 mA/cm$^2$ × 10 minutes | (cathodic) |
| +0.5 mA/cm$^2$ × 5 seconds | (anodic) |
| −0.5 mA/cm$^2$ × 2 minutes | (cathodic) |
| −2.0 mA/cm$^2$ × 10 minutes | (cathodic) |
| +0.5 mA/cm$^2$ × 5 seconds | (anodic) |
| −0.5 mA/cm$^2$ × 30 seconds | (cathodic) |

-continued

| | |
|---|---|
| −4.0 mA/cm² × 10 minutes | (cathodic) |
| +0.5 mA/cm² × 5 seconds | (anodic) |
| −0.5 mA/cm² × 1 minute | (cathodic) |
| −8.0 mA/cm² × 30 minutes | (cathodic) |

Each current transition was effected as a step change, or as close to a step change as was possible given the capabilities of current control instrumentation. Although the current can be ramped from cathodic to anodic and vice versa, there is not believed to be any material advantage in ramping the current. Thus, step change is generally preferred.

Figure 3B:
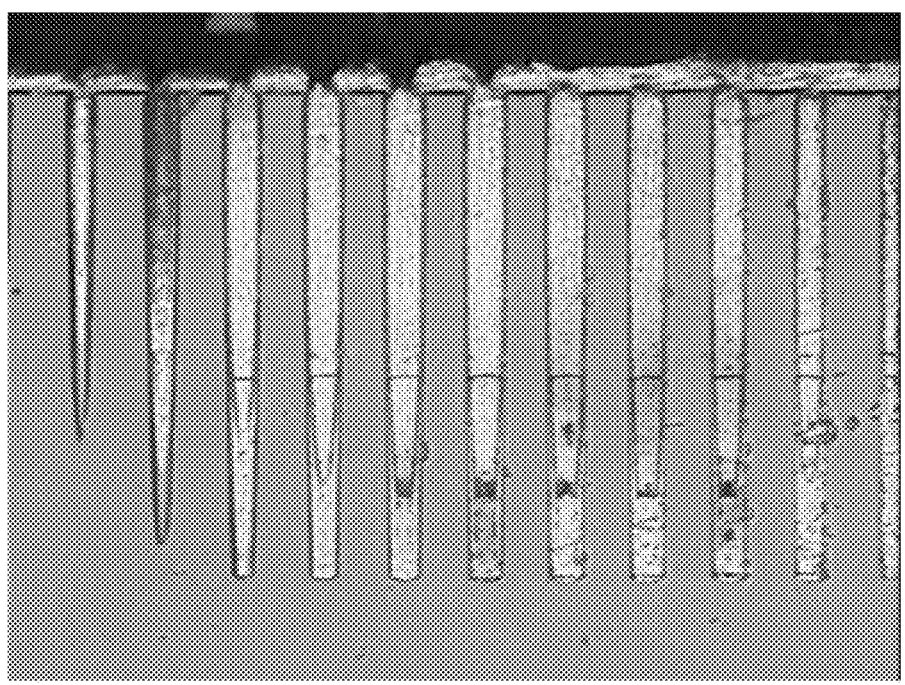
FIG. 3B is a photomicrograph of a section of an integrated chip showing vias filled by the plating process of the instant invention.

After completion of the current schedule outlined above, the chip was inspected and the vias determined to be 100% filled. FIG. 3B is a photomicrograph of a section of the chip that had been plated over a period of 60 minutes in accordance with the process of this example. As shown in the FIG. 3B, the vias were 100% filled. There were no voids or significant overburden or protusions.

Example 2

Using a plating solution containing 40 g/L copper ions, 20 g/L sulfuric acid, and otherwise similar to the electrolytic bath of Example 1, integrated circuit chips having varying via configurations were prepared and plated in the manner described in Example 1. One hundred percent filling of vias was achieved in 20 minutes for chips having via dimensions of 5µ×40µ and in 30 minutes for chips having via dimensions of 6µ×60µ and 55 minutes for chips having via dimensions of 8µ×100µ. Again the vias and field were free of voids, protrusions and overburden.

This example illustrates that any forward current interlude can comprise plural stages at different current densities and for different durations. It will be understood that the schedule of forward (cathodic) interludes and anodic intervals is subject to infinite variation, and that the schedule outlined above is merely exemplary, and preferred values will vary as a function of concentration, solution agitation, via features, the nature of the plating tool and other conventional parameters known to the art. Thus, the current schedule is best characterized by the limitations on ratios of cathodic to anodic current duration and charge transfer at the metalizing substrate, the cumulative anodic current duration and charge transfer, the duration and charge transfer in forward current interludes between anodic current intervals that are faradaically material and/or of material duration, and other parameters discussed above and defined in the appended claims.

Generally the current density in the forward current interludes can be progressively stepped up as the deposition process proceeds. At the outset of the filling cycle, the cathode comprises only the seed layer which is of limited conductivity and provides only a limited surface for electrolytic current. Thus, as defined with reference to the entire metalizing surface, the current is relatively low, e.g., in the 0.5 to 1.5 mA/cm² range. During this initial lower current density stage, copper deposition is generally conformal—in contrast to "bottom-up"—as the thin and sometimes discontinuous copper seed layer (having been pre-deposited by a non-electrolytic process such as chemical vapor deposition or physical vapor deposition, is converted to a continuous and thicker layer more capable of carrying current associated with bottom-up filling. As copper builds up and covers the metalizing substrate, thus transforming the initial seed layer, the current density can be significantly increased, thereby enhancing the rate of copper deposition and accelerating the completion of the filling cycle when functioning in concert with desorptive anodic intervals in concert with the further compositional and process parameters discussed hereinabove.

The process of the invention is applicable to the manufacture of integrated circuit devices wherein the semiconductor substrate may be, for example, a semiconductor wafer or chip. The semiconductor substrate is typically a silicon wafer or silicon chip, although other semiconductor materials, such as germanium, silicon germanium, silicon carbide, silicon germanium carbide, and gallium arsenide are applicable to the method of the present invention. The semiconductor substrate may be a semiconductor wafer or other bulk substrate that includes a layer of semiconductive material. The substrates include not only silicon wafers (e.g. monocrystalline silicon or polycrystalline silicon), but silicon on insulator ("SOI") substrates, silicon on sapphire ("SOS") substrates, silicon on glass ("SOG") substrates, epitaxial layers of silicon on a base semiconductor foundation, and other semiconductor materials, such as silicon-germanium, germanium, ruby, quartz, sapphire, gallium arsenide, diamond, silicon carbide, or indium phosphide.

The semiconductor substrate may have deposited thereon a dielectric (insulative) film, such as, for example, silicon oxide ($SiO_2$), silicon nitride ($SiN_x$), silicon oxynitride ($SiO_xN_y$), carbon-doped silicon oxides, or low-κ dielectrics. Low-κ dielectric refers to a material having a smaller dielectric constant than silicon dioxide (dielectric constant=3.9), such as about 3.5, about 3, about 2.5, about 2.2, or even about 2.0. Low-κ dielectric materials are desirable since such materials exhibit reduced parasitic capacitance compared to the same thickness of $SiO_2$ dielectric, enabling increased feature density, faster switching speeds, and lower heat dissipation. Low-κ dielectric materials can be categorized by type (silicates, fluorosilicates and organo-silicates, organic polymeric etc.) and by deposition technique (CVD; spin-on). Dielectric constant reduction may be achieved by reducing polarizability, by reducing density, or by introducing porosity. The dielectric layer may be a silicon oxide layer, such as a layer of phosphorus silicate glass ("PSG"), borosilicate glass ("BSG"), borophosphosilicate glass ("BPSG"), fluorosilicate glass ("FSG"), or spin-on dielectric ("SOD"). The dielectric layer may be formed from silicon dioxide, silicon nitride, silicon oxynitride, BPSG, PSG, BSG, FSG, a polyimide, benzocyclobutene, mixtures thereof, or another nonconductive material as known in the art. In one embodiment, the dielectric layer is a sandwich structure of $SiO_2$ and SiN, as known in the art. The dielectric layer may have a thickness ranging from approximately 0.5 micrometers to 10 micrometers. The dielectric layer may be formed on the semiconductor substrate by conventional techniques.

The electrolytic solution used in the process of the invention is preferably acidic, i.e., having a pH less than 7. Generally, the solution comprises a source of copper ions, a counteranion for the copper ions, an acid, an accelerator, a suppressor, and a leveler.

Preferably, the source of copper ions is copper sulfate or a copper salt of an alkylsulfonic acid such as, e.g., methane sulfonic acid. The counteranion of the copper ions is typically also the conjugate base of the acid, i.e., the electrolytic solution may conveniently comprise copper sulfate and sulfuric acid, copper mesylate and methane sulfonic acid, etc. The concentration of the copper source is generally sufficient to provide copper ion in a concentration from about 1 g/L copper ions to about 80 g/L copper ions, more typically about 4 g/L to about 110 g/L copper ions. The source of sulfuric acid is typically concentration sulfuric acid, but a dilute solution may be used. In general, the source of sulfuric acid is sufficient to provide from about 2 g/L sulfuric acid to about 225 g/L sulfuric acid in the copper plating solution. In this regard, suitable copper sulfate plating chemistries include high acid/low copper systems, low acid/high copper systems, and mid acid/high copper systems. In high acid/low copper systems, the copper ion concentration can be on the order of 4 g/L to on the order of 30 g/L; and the acid concentration may be sulfuric acid in an amount of greater than about 100 g/L up to about 225 g/L. In one high acid/low copper system, the copper ion concentration is about 17 g/L where the $H_2SO_4$ concentration is about 180 g/L. In some low acid/high copper systems, the copper ion concentration can be between about 35 g/L and about 85 g/L, such as between about 25 g/L and about 70 g/L. In some low acid/high copper systems, the copper ion concentration can be between about 46 g/L and about 60 g/L, such as between about 48 g/L and about 52 g/L. (35 g/L copper ion corresponds to about 140 g/L $CuSO_4.5H_2O$ copper sulfate pentahydrate.) The acid concentration in these systems is preferably less than about 100 g/L. In some low acid/high copper systems, the acid concentration can be between about 5 g/L and about 30 g/L, such as between about 10 g/L and about 15 g/L. In some low acid/high copper, the acid concentration can be between about 50 g/L and about 100 g/L, such as between about 75 g/L to about 85 g/L. In an exemplary low acid/high copper system, the copper ion concentration is about 40 g/L and the $H_2SO_4$ concentration is about 10 g/L. In another exemplary low acid/high copper system, the copper ion concentration is about 50 g/L and the $H_2SO_4$ concentration is about 80 g/L. In mid acid/high copper systems, the copper ion concentration can be on the order of 30 g/L to on the order of 60 g/L; and the acid concentration may be sulfuric acid in an amount of greater than about 50 g/L up to about 100 g/L. In one mid acid/high copper system, the copper ion concentration is about 50 g/L where the $H_2SO_4$ concentration is about 80 g/L.

Experimental results to date indicate that chemistries that employ copper sulfate/sulfuric acid achieved better metallization results in terms of faster gapfill.

Another advantage of employing copper sulfate/sulfuric is the deposited copper contained very low impurity concentrations. In this regard, the copper metallization may contain elemental impurities, such as carbon, sulfur, oxygen, nitrogen, and chloride in ppm concentrations or less. For example, copper metallization has been achieved having carbon impurity at concentrations of less than about 50 ppm, less than 30 ppm, less than 20 ppm, or even less than 15 ppm. Copper metallization has been achieved having oxygen impurity at concentrations of less than about 50 ppm, less than 30 ppm, less than 20 ppm, less than 15 ppm, or even less than 10 ppm. Copper metallization has been achieved having nitrogen impurity at concentrations of less than about 10 ppm, less than 5 ppm, less than 2 ppm, less than 1 ppm, or even less than 0.5 ppm. Copper metallization has been achieved having chloride impurity at concentrations of less than about 10 ppm, less than 5 ppm, less than 2 ppm, less than 1 ppm, less than 0.5 ppm, or even less than 0.1 ppm. Copper metallization has been achieved having sulfur impurity at concentrations of less than about 10 ppm, less than 5 ppm, less than 2 ppm, less than 1 ppm, or even less than 0.5 ppm.

The alternative use of copper methanesulfonate as the copper source allows for greater concentrations of copper ions in the electrolytic copper deposition composition in comparison to other copper ion sources. Accordingly, the source of copper ion may be added to achieve copper ion concentrations greater than about 50 g/L, greater than about 90 g/L, or even greater than about 100 g/L, such as, for example about 110 g/L. Preferably, the copper methane sulfonate is added to achieve a copper ion concentration between about 70 g/L and about 100 g/L.

When copper methane sulfonate is used, it is preferred to use methane sulfonic acid and its derivative and other organic sulfonic acids as the electrolyte. When methane sulfonic acid is added, its concentration may be between about 1 g/L and about 50 g/L, such as between about 5 g/L and about 25 g/L, such as about 20 g/L.

High copper concentrations in the bulk solution contribute to a steep copper concentration gradient that enhances diffusion of copper into the features. Experimental evidence to date indicates that the copper concentration is optimally determined in view of the aspect ratio of the feature to be copper metallized. For example, in embodiments wherein the feature has a relatively low aspect ratio, such as about 3:1, about 2.5:1, or about 2:1 (depth:opening diameter), or less, the concentration of the copper ion is added and maintained at the higher end of the preferred concentration range, such as between about 90 g/L and about 110 g/L, such as about 110 g/L. In embodiments wherein the feature has a relatively high aspect ratio, such as about 4:1, about 5:1, or about 6:1 (depth:opening diameter), or more, the concentration of the copper ion may be added and maintained at the lower end of the preferred concentration range, such as between about 50 g/L and about 90 g/L, such as between about 50 g/L and 70 g/L. Without being bound to a particular theory, it is thought that higher concentrations of copper ion for use in metallizing high aspect ratio features may increase the possibility of necking (which may cause voids). Accordingly, in embodiments wherein the feature has a relatively high aspect ratio, the concentration of the copper ion is optimally decreased. Similarly, the copper concentration may be increased in embodiments wherein the feature a relatively low aspect ratio.

Chloride ion may also be used in the bath at a level up to about 200 mg/L (about 200 ppm), preferably about 10 mg/L to about 90 mg/L (10 to 90 ppm), such as about 50 gm/L (about 50 ppm). Chloride ion is added in these concentration ranges to enhance the function of other bath additives. In particular, it has been discovered that the addition of chloride ion enhances void-free filling.

The accelerator component of the electrolytic bath preferably comprises an water-soluble organic divalent sulfur compound. A preferred class of accelerators has the following general structure (1):

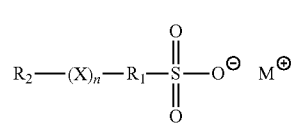

Structure (1)

wherein
X is O, S, or S=O;
n is 1 to 6;
M is hydrogen, alkali metal, or ammonium as needed to satisfy the valence;
$R_1$ is an alkylene or cyclic alkylene group of 1 to 8 carbon atoms, an aromatic hydrocarbon or an aliphatic aromatic hydrocarbon of 6 to 12 carbon atoms; and R$_2$ is hydrogen, hydroxyalkyl having from 1 to 8 carbon atoms, or MO$_3$SR$_1$ wherein M and R$_1$ are as defined above.

In certain preferred embodiments, X is sulfur, and n is 2, such that the organic sulfur compound is an organic disulfide compound. Preferred organic sulfur compounds of Structure (1) have the following structure (2):

Structure (2)
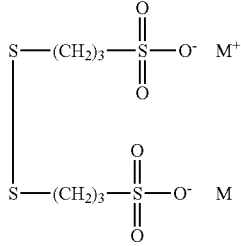

wherein M is a counter ion possessing charge sufficient to balance the negative charges on the oxygen atoms. M may be, for example, protons, alkali metal ions such as sodium and potassium, or another charge balancing cation such as ammonium or a quaternary amine.

One example of the organic sulfur compound of structure (2) is the sodium salt of 3,3'-dithiobis(1-propanesulfonate), which has the following structure (3):

Structure (3)
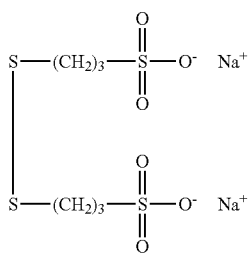

An especially preferred example of the organic sulfur compound of structure (2) is 3,3'-dithiobis(1-propanesulfonic acid), which has the following structure (4):

Structure (4)
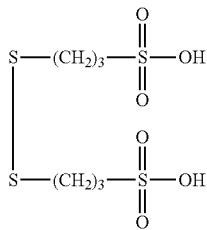

Additional organic sulfur compounds that are applicable are shown by structures (5) through (16):

Structure (5)
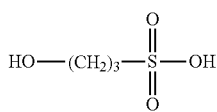

Structure (6)
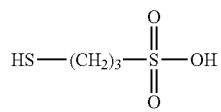

Structure (7)
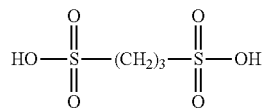

Structure (8)
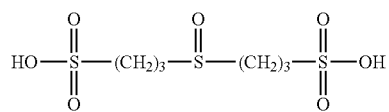

Structure (9)
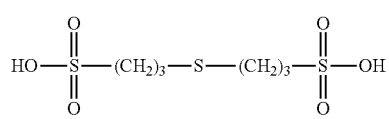

Structure (10)
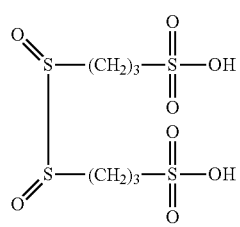

Structure (11)
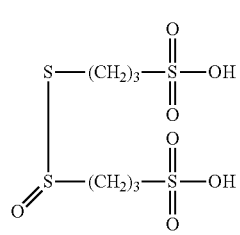

Structure (12a)
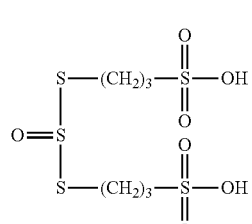

Structure (12b)
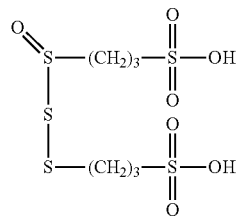

Structure (13)
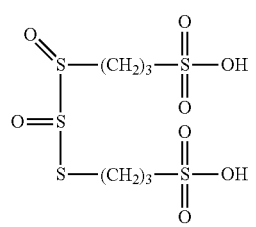

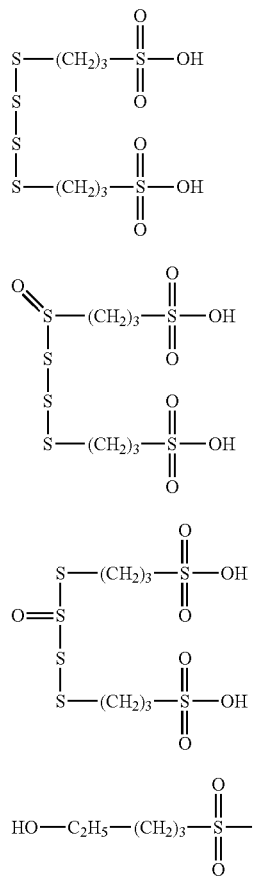

Structure (14)

Structure (15a)

Structure (15b)

Structure (16)

The concentration of the organic sulfur compound may range from about 0.1 ppm to about 100 ppm, such as between about 0.5 ppm to about 20 ppm, preferably between about 1 ppm and about 6 ppm, more preferably between about 1 ppm and about 3 ppm, such as about 1.5 ppm.

As the suppressor component, the electrolytic copper plating bath preferably comprises a polyether of relatively low moderately high molecular weight, e.g., 200 to 50,000, typically 300 to 10,000, more typically 300 to 5,000. The polyether generally comprises alkylene oxide repeat units, most typically ethylene oxide (EO) repeat units, propylene oxide (PO) repeat units, or combinations thereof. In those polymeric chains comprising both EO and PO repeat units, the repeat units may be arranged in random, alternating, or block configurations. The polymeric chains comprising alkylene oxide repeat units may contain residues derived from an initiating reagent used to initiate the polymerization reaction. Compounds applicable for use in the this invention include polypropylene glycol amine (PPGA), in particular poly(propylene glycol)bis(2-aminopropyl ether) (400 g/mol) and low molecular weight polypropylene glycol (PPG). As described, e.g., in U.S. Pat. No. 6,776,893 which is expressly incorporated herein by reference, a polyether suppressor may comprise a block copolymer of polyoxyethylene and polyoxypropylene, a polyoxyethylene or polyoxypropylene derivative of a polyhydric alcohol and a mixed polyoxyethylene and polyoxypropylene derivative of a polyhydric alcohol.

A preferred polyether suppressor compound as described in U.S. Pat. No. 6,776,893 is a polyoxyethylene and polyoxypropylene derivative of glycerine. One such example is propoxylated glycerine having a molecular weight of about 700 g/mol. Another such compound is EO/PO on glycerine having a molecular weight of about 2500 g/mol. Yet another example comprises an EO/PO polyether chain comprising a naphthyl residue, wherein the polyether chain is terminated with a sulfonate moiety. Such a material is available under the trade designation Ralufon NAPE 14-00 from Raschig.

U.S. Pat. No. 7,303,992, also expressly incorporated herein by reference, describes a suppressor that comprises a combination of propylene oxide (PO) repeat units and ethylene oxide (EO) repeat units present in a PO:EO ratio between about 1:9 and about 9:1 and bonded to a nitrogen-containing species, wherein the molecular weight of the suppressor compound is between about 1000 and about 30,000 Alternative suppressors are well known in the art.

The polyether polymer compound concentration may range from about 1 ppm to about 1000 ppm, such as between about 5 ppm to about 200 ppm, preferably between about 10 ppm and about 100 ppm, more preferably between about 10 ppm and about 50 ppm, such as between about 10 ppm and about 20 ppm.

As the leveler, the electrolytic copper plating compositions may further comprise a polymeric material comprising nitrogen containing repeat units. It will be understood that other levelers can be used, but nitrogenous polymeric levelers are preferred.

As a specific example, the leveler may comprise a reaction product of benzyl chloride and hydroxyethyl polyethyleneimine. Such a material may be formed by reacting benzyl chloride with a hydroxyethyl polyethyleneimine that is available under the tradename Lupasol SC 61B from BASF Corporation of Rensselear, N.Y.). The hydroxyethyl polyethyleneimine has a molecular weight generally in the range of 50,000 to about 160,000.

In some embodiments, the additive comprises vinyl-pyridine based compounds. In one embodiment, the compound is a pyridinium compound and, in particular, a quaternized pyridinium salt. A pyridinium compound is a compound derived from pyridine in which the nitrogen atom of the pyridine is protonated. A quaternized pyridinium salt is distinct from pyridine, and quaternized pyridinium salt-based polymers are distinct from pyridine-based polymers, in that the nitrogen atom of the pyridine ring is quaternized in the quaternized pyridinium salt and quaternized pyridinium salt-based polymers. These compounds include derivatives of a vinyl pyridine, such as derivatives of 2-vinyl pyridine, 3-vinyl pyridine, and, in certain preferred embodiments, derivatives of 4-vinyl pyridine. The polymers of the invention encompass homo-polymers of vinyl pyridine, co-polymers of vinyl pyridine, quaternized salts of vinyl pyridine, and quaternized salts of these homo-polymers and co-polymers.

Some specific examples of quaternized poly(4-vinyl pyridine) include, for example, the reaction product of poly(4-vinyl pyridine) with dimethyl sulfate, the reaction product of 4-vinyl pyridine with 2-chloroethanol, the reaction product of 4-vinyl pyridine with benzylchloride, the reaction product of 4-vinyl pyridine with allyl chloride, the reaction product of 4-vinyl pyridine with 4-chloromethylpyridine, the reaction product of 4-vinyl pyridine with 1,3-propane sultone, the reaction product of 4-vinyl pyridine with methyl tosylate, the reaction product of 4-vinyl pyridine with chloroacetone, the reaction product of 4-vinyl pyridine with 2-methoxyethoxymethylchloride, and the reaction product of 4-vinyl pyridine with 2-chloroethylether.

Some examples of quaternized poly(2-vinyl pyridine) include, for example, the reaction product of 2-vinyl pyridine with methyl tosylate, the reaction product of 2-vinyl pyridine with dimethyl sulfate, the reaction product of vinyl pyridine and a water soluble initiator, poly(2-methyl-5-vinyl pyridine), and 1-methyl-4-vinylpyridinium trifluoromethyl sulfonate, among others.

An example of a co-polymer is vinyl pyridine co-polymerized with vinyl imidazole.

The molecular weight of the substituted pyridyl polymer compound additives of the invention in one embodiment is on the order of about 160,000 g/mol or less. While some higher molecular weight compounds are difficult to dissolve into the electroplating bath or to maintain in solution, other higher molecular weight compounds are soluble due to the added solubilizing ability of the quaternary nitrogen cation. The concept of solubility in this context is reference to relative solubility, such as, for example, greater than 60% soluble, or some other minimum solubility that is effective under the circumstances. It is not a reference to absolute solubility. The foregoing preference of 160,000 g/mol or less in certain embodiments is not narrowly critical. In one embodiment, the molecular weight of the substituted pyridyl polymer compound additive is about 150,000 g/mol, or less. Preferably, the molecular weight of the substituted pyridyl polymer compound additive is at least about 500 g/mol. Accordingly, the molecular weight of the substituted pyridyl polymer compound additive may be between about 500 g/mol and about 150,000 g/mol, such as about 700 g/mol, about 1000 g/mol, and about 10,000 g/mol. The substituted pyridyl polymers selected are soluble in the plating bath, retain their functionality under electrolytic conditions, and do not yield deleterious by-products under electrolytic conditions, at least neither immediately nor shortly thereafter.

In those embodiments where the compound is a reaction product of a vinyl pyridine or poly(vinyl pyridine), it is obtained by causing a vinyl pyridine or poly(vinyl pyridine) to react with an alkylating agent selected from among those which yield a product which is soluble, bath compatible, and effective for leveling. In one embodiment candidates are selected from among reaction products obtained by causing vinyl pyridine or poly(vinyl pyridine) to react with a compound of the following structure (17):

$R_1$-L Structure (17)

wherein $R_1$ is alkyl, alkenyl, aralkyl, heteroarylalkyl, substituted alkyl, substituted alkenyl, substituted aralkyl, or substituted heteroarylalkyl; and L is a leaving group.

A leaving group is any group that can be displaced from a carbon atom. In general, weak bases are good leaving groups. Exemplary leaving groups are halides, methyl sulfate, tosylates, and the like.

In other embodiments, $R_1$ is alkyl or substituted alkyl; preferably, $R_1$ is substituted or unsubstituted methyl, ethyl, straight, branched or cyclic propyl, butyl, pentyl or hexyl; in one embodiment $R_1$ is methyl, hydroxyethyl, acetylmethyl, chloroethoxyethyl or methoxyethoxymethyl.

In further embodiments, $R_1$ is alkenyl; preferably, $R_1$ is vinyl, propenyl, straight or branched butenyl, straight, branched or cyclic pentenyl or straight, branched, or cyclic hexenyl; in one embodiment $R_1$ is propenyl.

In yet additional embodiments, $R_1$ is aralkyl or substituted aralkyl; preferably, $R_1$ is benzyl or substituted benzyl, naphthylalkyl or substituted naphthylalkyl; in one embodiment R1 is benzyl or naphthylmethyl.

In still other embodiments, $R_1$ is heteroarylalkyl or substituted heteroarylalkyl; preferably, $R_1$ is pyridylalkyl; particularly, $R_1$ is pyridylmethyl.

In various embodiments, L is chloride, methyl sulfate ($CH_2SO_4^-$), octyl sulfate ($C_8H_{18}SO_4^-$), trifluoromethanesulfonate ($CF_2SO_2^-$), tosylate ($C_7H_7SO_2^-$), or chloroacetate ($CH_2ClC(O)O^-$); preferably, L is methyl sulfate, chloride or tosylate.

Water soluble initiators can be used to prepare polymers of vinyl pyridine, though they are not used in the currently preferred embodiments or in the working examples. Exemplary water soluble initiators are peroxides (e.g., hydrogen peroxide, benzoyl peroxide, peroxybenzoic acid, etc.) and the like, and water soluble azo initiators such as 4,4'-Azobis (4-cyanovaleric acid).

In a variety of embodiments, the leveler component comprises a mixture of one of the above-described polymers with a quantity of a monomer which is, for example, a monomeric vinyl pyridine derivative compound. In one such embodiment, the mixture is obtained by quaternizing a monomer to yield a quaternized salt which then undergoes spontaneous polymerization. The quaternized salt does not completely polymerize; rather, it yields a mixture of the monomer and spontaneously generated polymer.

The compound may be prepared by quaternizing 4-vinyl pyridine by reaction with dimethyl sulfate. Polymerization occurs according to the following reaction scheme (45-65° C.)

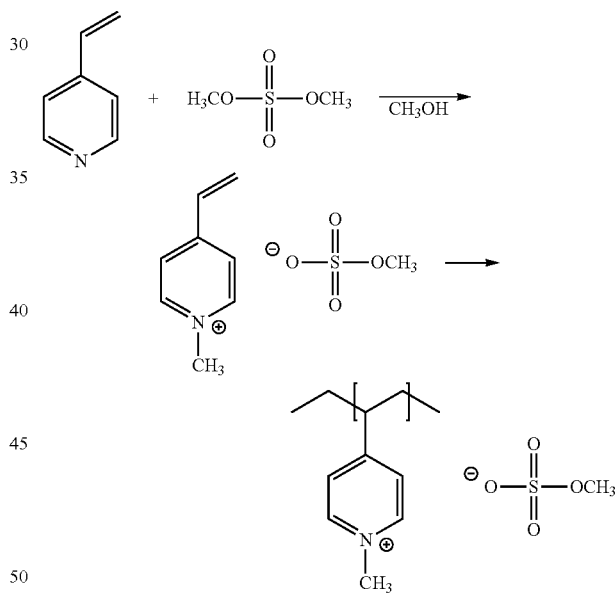

The average molecular weight of the polymer is generally less than 10,000 g/mol. The monomer fraction may be increased with an increase in amount of methanol used in the quaternization reaction; that is, the degree of spontaneous polymerization is decreased.

In some embodiments, the composition may comprise compounds comprising quaternized dipyridyls. In general, quaternized dipyridyls are derived from the reaction between a dipyridyl compound and an alkylating reagent. Although such a reaction scheme is a common method of quaternizing dipyridyls, the compounds are not limited to only those reaction products that are derived from the reaction between a dipyridyl compound and an alkylating reagent, but rather to any compound having the functionality described herein below.

Dipyridyls that may be quaternized to prepare the levelers of the present invention have the general structure (18):

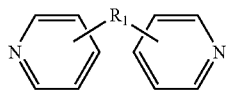

Structure (18)

wherein $R_1$ is a moiety that connects the pyridine rings. In Structure (18), each line from $R_1$ to one of the pyridine rings denotes a bond between an atom in the $R_1$ moiety and one of the five carbon atoms of the pyridine ring. In some embodiments, $R_1$ denotes a single bond wherein one carbon atom from one of the pyridine rings is directly bonded to one carbon atom from the other pyridine ring.

In some embodiments, the $R_1$ connection moiety may be an alkyl chain, and the dipyridyl may have the general structure (19):

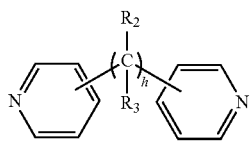

Structure (19)

wherein h is an integer from 0 to 6, and $R_2$ and $R_3$ are each independently selected from among hydrogen or a short alkyl chain having from 1 to about 3 carbon atoms. In Structure (19), each line from a carbon in the alkyl chain to one of the pyridine rings denotes a bond between a carbon atom in the alkyl chain and one of the five carbon atoms of the pyridine ring. In embodiments wherein h is 0, the connecting moiety is a single bond, and one carbon atom from one of the pyridine rings is directly bonded to one carbon atom from the other pyridine ring. In certain preferred embodiments, h is 2 or 3. In certain preferred embodiments, h is 2 or 3, and each $R_2$ and $R_3$ is hydrogen.

In some embodiments, the $R_1$ connecting moiety may contain a carbonyl, and the dipyridyl may have the general structure (20):

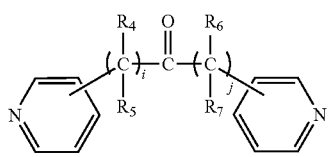

Structure (20)

wherein i and j are integers from 0 to 6, and $R_4$, $R_5$, $R_6$, and $R_6$ are each independently selected from among hydrogen or a short alkyl chain having from 1 to about 3 carbon atoms. In Structure (20), each line from a carbon in the connecting moiety to one of the pyridine rings denotes a bond between the carbon atom in the connecting moiety and one of the five carbon atoms of the pyridine ring. In embodiments wherein i and j are both 0, the carbon atom of the carbonyl is directly bonded to one carbon atom in each of the pyridine rings.

Two compounds in the general class of dipyridyls of structure (20), in which i and j are both 0, are 2,2'-dipyridyl ketone (structure (21)) and 4,4'-dipyridyl ketone (structure (22)), having the structures shown below:

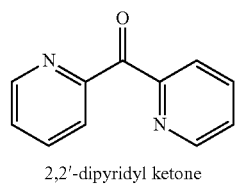

Structure (21)

2,2'-dipyridyl ketone

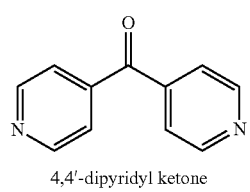

Structure (22)

4,4'-dipyridyl ketone

In some embodiments, the $R_1$ connecting moiety may contain an amine, and the dipyridyl may have the general structure (23):

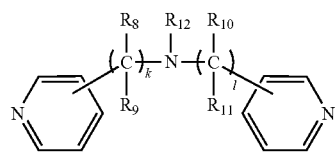

Structure (23)

wherein k and l are integers from 0 to 6, and $R_8$, $R_9$, $R_{10}$, $R_{11}$, and $R_{12}$ are each independently selected from among hydrogen or a short alkyl chain having from 1 to about 3 carbon atoms. In Structure (23), each line from a carbon in the connecting moiety to one of the pyridine rings denotes a bond between the carbon atom in the connecting moiety and one of the five carbon atoms of the pyridine ring. In embodiments wherein k and l are both 0, the nitrogen is directly bonded to one carbon atom in each of the pyridine rings.

One compound in the general class of dipyridyls of structure (23), in which k and l are both 0 and $R_{12}$ is hydrogen, is dipyridin-4-ylamine having the structure (24) shown below:

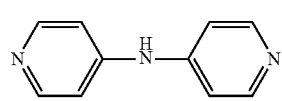

Structure (24)

di (pyridin-4-yl) amine

In some embodiments, the $R_1$ connecting moiety comprises another pyridine. Such a structure is actually a terpyridine having the general structure (25):

Structure (25)

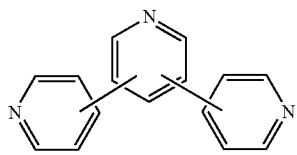

In this structure, each line from each pyridine ring denotes a bond between one carbon on one ring and another carbon on another ring.

One such compound in the general class compounds of structure (25) is a terpyridine having the structure (26):

Structure (26)

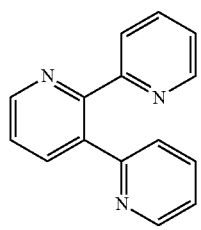

terpyridine

Preferably, the dipyridyl is chosen from the general class of dipyridyls of general structure (19), and further in which $R_2$ and $R_3$ are each hydrogen. These dipyridyls have the general structure (27):

Structure (27)

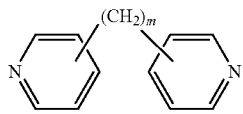

wherein m is an integer from 0 to 6. In Structure (27), each line from a carbon atom in the alkyl chain to one of the pyridine rings denotes a bond between a carbon atom in the alkyl chain and one of the five carbon atoms of the pyridine ring. In embodiments wherein m is 0, the connecting moiety is a single bond, and one carbon atom from one of the pyridine rings is directly bonded to one carbon atom from the other pyridine ring. In certain preferred embodiments, m is 2 or 3.

Dipyridyls of the above general structure (27) include 2,2'-dipyridyl compounds, 3,3'-dipyridyl compounds, and 4,4'-dipyridyl compounds, as shown in the following structures (28), (29), and (30), respectively:

Structure (28)

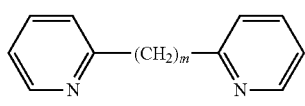

Structure (29)

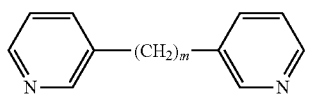

Structure (30)

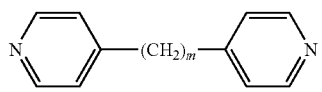

wherein m is an integer from 0 to 6. When m is 0, the two pyridine rings are directly bonded to each other through a single bond. In preferred embodiments, m is 2 or 3.

2,2'-dipyridyl compounds include 2,2'-dipyridyl, 2,2'-ethylenedipyridine (1,2-Bis(2-pyridyl)ethane), Bis(2-pyridyl)methane, 1,3-Bis(2-pyridyl)propane, 1,4-Bis(2-pyridyl)butane, 1,5-Bis(2-pyridyl)pentane, and 1,6-Bis(2-pyridyl)hexane.

3,3'-dipyridyl compounds include 3,3'-dipyridyl, 3,3'-ethylenedipyridine (1,2-Bis(3-pyridyl)ethane), Bis(3-pyridyl)methane, 1,3-Bis(3-pyridyl)propane, 1,4-Bis(3-pyridyl)butane, 1,5-Bis(3-pyridyl)pentane, and 1,6-Bis(3-pyridyl)hexane.

4,4'-dipyridyl compounds include, for example, 4,4'-dipyridyl, 4,4'-ethylenedipyridine (1,2-Bis(4-pyridyl)ethane), Bis(4-pyridyl)methane, 1,3-Bis(4-pyridyl)propane, 1,4-Bis(4-pyridyl)butane, 1,5-Bis(4-pyridyl)pentane, and 1,6-Bis(4-pyridyl)hexane.

Of these dipyridyl compounds, 4,4'-dipyridyl compounds are preferred since compounds based on 4,4'-dipyridyl have been found to be particularly advantageous levelers in terms of achieving low impurity inclusion and underplate and overplate reduction. In particular, 4,4'-dipyridyl, having the structure (31), 4,4'-ethylenedipyridine, having structure (32), and 1,3-Bis(4-pyridyl)propane having structure (33) are more preferred. Compounds based on the dipyridyls of structure (32) and (33) are currently the most preferred levelers.

Structure (31)

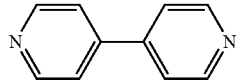

Structure (32)

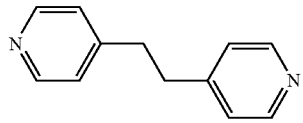

Structure (33)

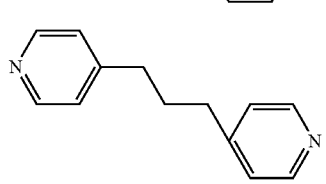

These compounds are quaternized dipyridyl compounds, typically prepared by alkylating at least one and preferably both of the nitrogen atoms. Alkylation occurs by reacting the above-described dipyridyl compounds with an alkylating agent. In some embodiments, the alkylating agent may be of a type particularly suitable for forming polymers. In some embodiments, the alkylating agent is of a type that reacts with the dipyridyl compound but does not form polymers.

Alkylating agents that are suitable for reacting with dipyridyl compounds that generally form non-polymeric levelers may have the general structure (34):

Y—(CH$_2$)$_o$-A    Structure (34)

wherein

A may be selected from among hydrogen, hydroxyl (—OH), alkoxy (—OR₁), amine (—NR₂R₃R₄), glycol

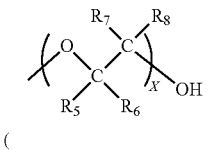

aryl

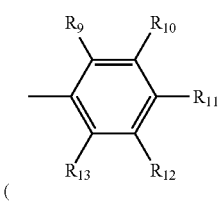

and sulfhydryl or thioether (—SR₁₄);

o is an integer between one and six, preferably one or two; and

X is an integer from one to about four, preferably one or two; and

Y is a leaving group. The leaving group may be selected from among, for example, chloride, bromide, iodide, tosyl, triflate, sulfonate, mesylate, dimethyl sulfonate, fluorosulfonate, methyl tosylate, brosylate, or nosylate.

In each A group above, the single line emanating from the functional moiety denotes a bond between an atom in the A moiety, e.g., oxygen, nitrogen, or carbon, and a carbon of the —(CH₂)ₒ— alkylene group. Additionally, the R₁ through R₁₄ groups denoted in the A moieties of Structure (34) are independently hydrogen; substituted or unsubstituted alkyl having from one to six carbon atoms, preferably one to three carbon atoms; substituted or unsubstituted alkylene having from one to six carbon atoms, preferably from one to three carbon atoms; or substituted or unsubstituted aryl. The alkyl may be substituted with one or more of the following substituents: halogen, heterocyclo, alkoxy, alkenoxy, alkynoxy, aryloxy, hydroxy, protected hydroxy, hydroxycarbonyl, keto, acyl, acyloxy, nitro, amino, amido, nitro, phosphono, cyano, thiol, ketals, acetals, esters and ethers. In general, the various alkyl R groups are hydrogen or unsubstituted alkyl.

With regard to the aryl group, any of the R₆ through R₁₀ carbons, together with an adjacent R group and the carbons to which they are bonded may form an aryl group, i.e., the aryl group comprises a fused ring structure, such as a naphthyl group.

Exemplary A groups include:
hydrogen,
hydroxyl (—OH),
methoxy (—OCH₃),
ethoxy (—OCH₂CH₃),
propoxy

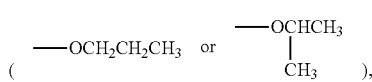

amino (—NH₂),
methylamino (—NHCH₃),
dimethylamino

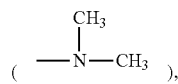

ethylene glycol (—O—CH₂CH₂—OH),
diethylene glycol (—(O—CH₂CH₂)₂OH,
propylene glycol

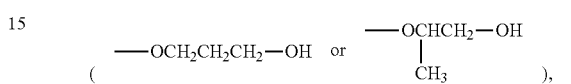

dipropylene glycol

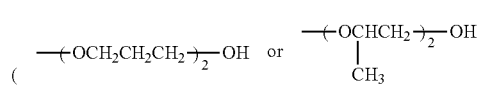

phenyl

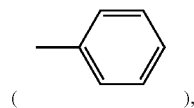

naphthenyl

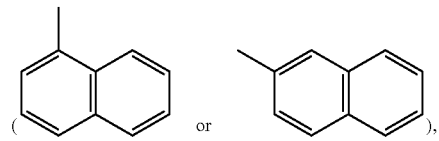

and
sulfhydryl (—SH), or derivatives of each of these.
Preferably, A is selected from among:
hydrogen,
hydroxyl (—OH),
methoxy (—OCH₃),
ethoxy (—OCH₂CH₃),
propoxy

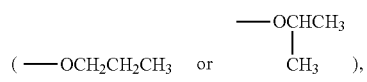

ethylene glycol (—O—CH₂CH₂—OH),
diethylene glycol (—(O—CH₂CH₂)₂OH),
propylene glycol

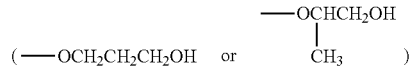

phenyl

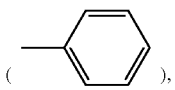

and
naphthenyl

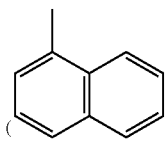 or 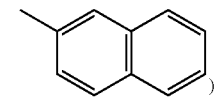

or derivatives of each of these.
More preferably, A is selected from among:
hydroxyl (—OH),
ethylene glycol (—O—CH$_2$CH$_2$—OH),
propylene glycol

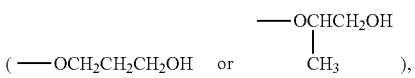
(—OCH$_2$CH$_2$CH$_2$OH   or   —OCHCH$_2$OH / CH$_3$), and
phenyl

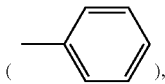

or derivatives of each of these.

Preferably, in the alkylating agents of Structure (34), o is one or two, and Y is chloride.

Alkylating agents that react with the dipyridyl compounds and generally form polymeric compounds may have the general structure (35):

Y—(CH$_2$)$_p$—B—(CH$_2$)$_q$—Z        Structure (35)

wherein
B may be selected from among:
a single bond, an oxygen atom (—O—), a methenyl hydroxide

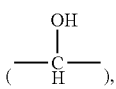

a carbonyl

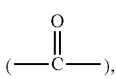

an amino

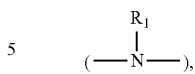

an imino

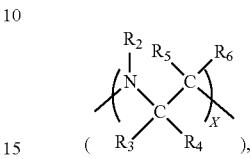

a sulfur atom (—S—), a sulfoxide

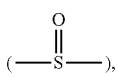

a phenylene

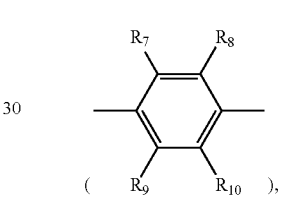

and a glycol

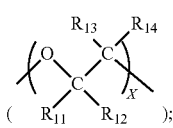

and
p and q may be the same or different, are integers between 0 and 6, preferably from 0 to 2, wherein at least one of p and q is at least 1;

X is an integer from one to about four, preferably one or two; and

Y and Z are leaving groups. The leaving group may be selected from among, for example, chloride, bromide, iodide, tosyl, triflate, sulfonate, mesylate, methosulfate, fluorosulfonate, methyl tosylate, brosylate, or nosylate.

In each B group above, the single line emanating from the functional moiety denotes a bond between an atom in the B moiety, e.g., oxygen, nitrogen, or carbon, and a carbon of the —(CH$_2$)$_p$— and —(CH$_2$)$_q$— alkylene groups. Additionally, the R$_1$ through R$_{14}$ groups in denoted in the B moieties of Structure (35) are independently hydrogen; substituted or unsubstituted alkyl having from one to six carbon atoms, preferably one to three carbon atoms; substituted or unsubstituted alkylene having from one to six carbon atoms, preferably from one to three carbon atoms; or substituted or unsubstituted aryl. The alkyl may be substituted with one or more of the following substituents: halogen, heterocyclo, alkoxy, alkenoxy, alkynoxy, aryloxy, hydroxy, protected hydroxy, hydroxycarbonyl, keto, acyl, acyloxy, nitro, amino, amido, nitro, phosphono, cyano, thiol, ketals, acetals, esters and ethers. In general, the various R groups are hydrogen or unsubstituted alkyl, and even more preferably, the R groups are hydrogen.

Preferably, B is selected from among:

an oxygen atom (—O—), a methenyl hydroxide

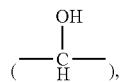

a carbonyl

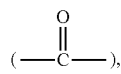

a phenylene group

an ethylene glycol group

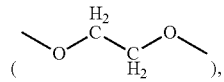

and a propylene glycol group

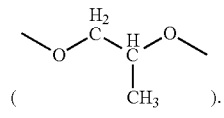

More preferably, B is selected from among:

an oxygen atom (—O—), a methenyl hydroxide

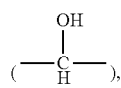

a carbonyl

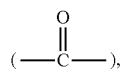

a phenylene group

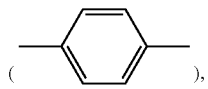

and an ethylene glycol group

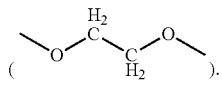

Preferably, in the alkylating agents of Structure (35), p and q are both one or are both two, and Y and Z are both chloride.

Another class of alkylating agents that may form a polymeric leveler when reacted with the dipyridyl compounds includes an oxirane ring and has the general structure (36):

Structure (36)
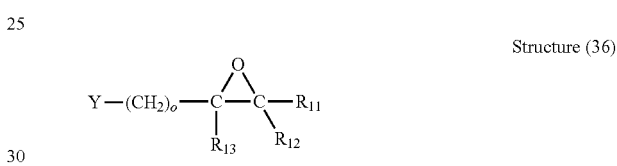

wherein $R_{11}$, $R_{12}$, and $R^{13}$ are hydrogen or substituted or unsubstituted alkyl having from one to six carbon atoms, preferably from one to three carbon atoms;

o is an integer between one and six, preferably one or two; and

Y is a leaving group. The leaving group may be selected from among, for example, chloride, bromide, iodide, tosyl, triflate, sulfonate, mesylate, methosulfate, fluorosulfonate, methyl tosylate, brosylate, or nosylate.

Preferably, $R_{11}$, $R_{12}$, and $R_{13}$ are hydrogen and the alkylating agent has the following general structure (37):

Structure (37)

wherein o and Y are as defined in connection with Structure (36).

Preferably, o is one, Y is chloride, and the alkylating agent of general Structure (36) is epichlorohydrin.

The reaction product causes the leaving group to form an anion in the reaction mixture. Since chloride is commonly added to electrolytic copper plating compositions, Y and Z are preferably chloride. While the other leaving groups may be used to form the leveling compounds of the present invention, these are less preferred since they may adversely affect the electrolytic plating composition. Leveling agents that are charge balanced with, for example, bromide or iodide, are preferably ion exchanged with chloride prior to adding the leveling compound to the electrolytic copper plating compositions of the present invention.

Specific alkylating agents of the above structure (34) include, for example, 2-chloroethylether, benzyl chloride, 2-(2-chloroethoxy)ethanol, chloroethanol, 1-(chloromethyl)-4-vinylbenzene, and 1-(chloromethyl)naphthalene.

Specific alkylating agents of the above structure (35) include, for example, 1-chloro-2-(2-chloroethoxy)ethane, 1,2-bis(2-chloroethoxy)ethane, 1,3-dichloropropan-2-one, 1,3-dichloropropan-2-ol, 1,2-dichloroethane, 1,3-dichloropropane, 1,4-dichlorobutane, 1,5-dichloropentane, 1,6-dichlorohexane, 1,7-dichloroheptane, 1,8-dichlorooctane, 1,2-di(2-chloroethyl)ether, 1,4-bis(chloromethyl)benzene, m-di(chloromethyl)benzene, and o-di(chloromethyl)benzene.

A specific alkylating agent of the above structure (36) is epichlorohydrin. The alkylating agents may comprise bromide, iodide, tosyl, triflate, sulfonate, mesylate, dimethyl sulfonate, fluorosulfonate, methyl tosylate, brosylate, or nosylate derivatives of the above chlorinated alkylating agents, but these are less preferred since chloride ion is typically added to electrolytic copper plating compositions, and the other anions may interfere with copper deposition.

A wide variety of leveler compounds may be prepared from the reaction of the dipyridyl compounds having the structures (18) through (33) and the alkylating agents having the general structures (34) through (37). Reactions to prepare the leveler compounds may occur according to the conditions described in Nagase et al., U.S. Pat. No. 5,616,317, the entire disclosure of which is hereby incorporated as if set forth in its entirety. In the reaction, the leaving groups are displaced when the nitrogen atoms on the pyridyl rings react with and bond to the methylene groups in the dihalogen compound. Preferably, the reaction occurs in a compatible organic solvent, preferably having a high boiling point, such as ethylene glycol or propylene glycol.

In some embodiments, the leveler compounds of the present invention are polymers, and the levelers may be prepared by selecting reaction conditions, i.e., temperature, concentration, and the alkylating agent such that the dipyridyl compound and alkylating agent polymerize, wherein the repeat units of the polymer comprise one moiety derived from the dipyridyl compound and one moiety derived from the alkylating. In some embodiments, the dipyridyl compound has the structure (27) and the alkylating agent has the general structure depicted above in Structure (35). In some embodiments, therefore, the leveler compound is a polymer comprising the following general structure (38):

Structure (38)

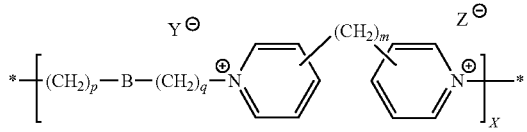

wherein B, m, p, q, Y, and Z are as defined with regard to structures (27) and (35), and X is an integer that is at least 2. Preferably, X ranges from 2 to about 100, such as from about 2 to about 50, from about 2 to about 25, and even more preferably from about 4 to about 20.

As stated above, preferred dipyridyl compounds are based on 4,4'-dipyridyl compounds. In some preferred embodiments, the leveler compound is a reaction product of 4,4'-dipyridyl of structure (31) and an alkylating agent of structure (35). Reaction conditions, i.e., temperatures, relative concentrations, and choice of alkylating agent may be selected such that 4,4'-dipyridyl and the alkylating agent polymerize, wherein the repeat units of the polymer comprise one moiety derived from 4,4'-dipyridyl and one moiety derived from the alkylating agent. In some embodiments, therefore, the leveler compound is a polymer comprising the following general structure (39):

Structure (39)

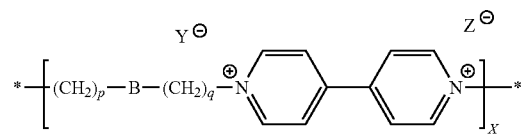

wherein B, p, q, Y, and Z are as defined with regard to structure (35), and X is an integer of at least 2, preferably from 2 to 100, such as from 2 to 50, and more preferred from 3 to about 20.

One particular leveler compound in the class of levelers of structure (39) is the reaction product of the 4,4'-dipyridyl and an alkylating agent wherein B is the oxygen atom, p and q are both 2, and Y and Z are both chloride, i.e., 1-chloro-2-(2-chloroethoxy)ethane. This leveler compound is a polymer comprising the following structure (40):

Structure (40)

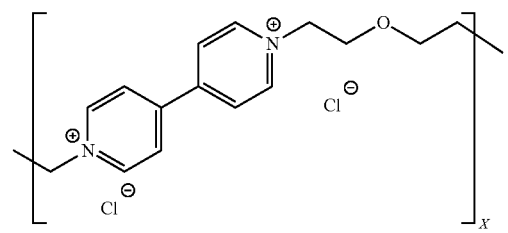

wherein X is an integer of at least 2, preferably from 2 to 100, such as from 2 to 50, and more preferred from 3 to about 20.

In some preferred embodiments, the leveler compound is a reaction product of 4,4'-dipyridyl of structure (32) and an alkylating agent of structure (35). Reaction conditions, i.e., temperatures, relative concentrations, and choice of alkylating agent may be selected such that 4,4'-ethylenedipyridine and the alkylating agent polymerize, wherein the repeat units of the polymer comprise one moiety derived from 4,4'-ethylenedipyridine and one moiety derived from the alkylating agent. In some embodiments, therefore, the leveler compound is a polymer comprising the following general structure (41):

Structure (41)

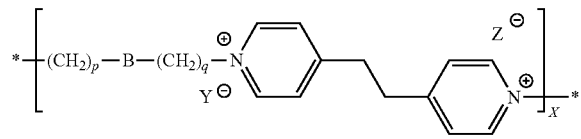

wherein B, p, q, Y, and Z are as defined with regard to structure (35) and X is an integer of at least 2, preferably from 2 to 100, such as from 2 to 50, and more preferred from 3 to about 20.

One particular leveler compound in the class of levelers of structure (41) is polymer that may be prepared from reacting 4,4'-ethylenedipyridine and an alkylating agent wherein B is the oxygen atom, p and q are both 2, and Y and Z are both chloride, i.e., 1-chloro-2-(2-chloroethoxy)ethane. This leveler compound is a polymer comprising the following structure (42):

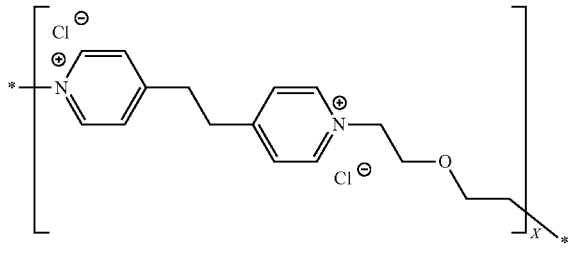

Structure (42)

wherein X is an integer of at least 2, preferably from 2 to 100, such as from 2 to 50, and more preferred from 3 to about 20. In one preferred leveler of structure (42), X is an average value from about 3 to about 12, such as between about 4 and about 8, or even about 5 to about 6. In one preferred leveler of structure (42), X is an average value from about 10 to about 24, such as between about 12 to about 18, or even about 13 to about 14.

Another leveler compound in the class of levelers of structure (41) is a polymer that may be prepared by reacting 4,4'-ethylenedipyridine and an alkylating agent wherein B is the ethylene glycol, p and q are both 2, and Y and Z are both chloride, i.e., 1,2-bis(2-chloroethoxy)ethane. This leveler compound is a polymer comprising the following structure (43):

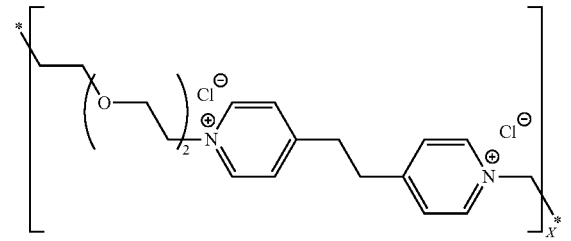

Structure (43)

wherein X is an integer of at least 2, preferably from 2 to 100, such as from 2 to 50, and more preferred from 3 to about 20.

Another leveler compound in the class of levelers of structure (41) is a polymer that may be prepared by reacting 4,4'-ethylenedipyridine and an alkylating agent wherein B is the carbonyl, p and q are both 1, and Y and Z are both chloride, i.e., 1,3-dichloropropan-2-one. This leveler compound is a polymer comprising the following structure (44):

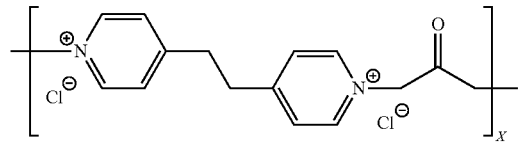

Structure (44)

wherein X is an integer of at least 2, preferably from 2 to 100, such as from 2 to 50, and more preferred from 3 to about 20.

Another leveler compound in the class of levelers of structure (41) is a polymer that may be prepared by reacting 4,4'-ethylenedipyridine and an alkylating agent wherein B is the methenyl hydroxide, p and q are both 1, and Y and Z are both chloride, i.e., 1,3-dichloropropan-2-ol. This leveler compound is a polymer comprising the following structure (45):

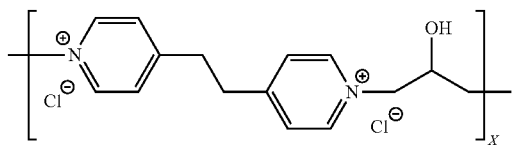

Structure (45)

wherein X is an integer of at least 2, preferably from 2 to 100, such as from 2 to 50, and more preferred from 3 to about 20.

Another leveler compound in the class of levelers of structure (41) is a polymer that may be prepared by reacting 4,4'-ethylenedipyridine and an alkylating agent wherein B is the phenylene, p and q are both 1, and Y and Z are both chloride, i.e., 1,4-bis(chloromethyl)benzene. This leveler compound is a polymer comprising the following structure (46):

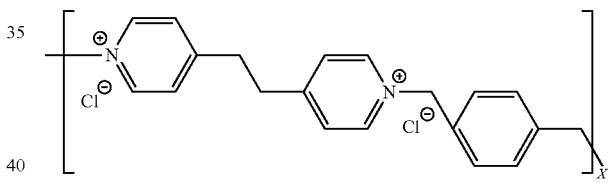

Structure (46)

wherein X is an integer of at least 2, preferably from 2 to 100, such as from 2 to 50, and more preferred from 3 to about 20.

In some preferred embodiments, the leveler compound is a reaction product of 4,4'-dipyridyl of structure (33) and an alkylating agent of structure (35). Reaction conditions, i.e., temperatures, relative concentrations, and choice of alkylating agent may be selected such that 1,3-di(pyridin-4-yl) propane and the alkylating agent polymerize, wherein the repeat units of the polymer comprise one moiety derived from 1,3-di(pyridin-4-yl)propane and one moiety derived from the alkylating agent. In some embodiments, therefore, the leveler compound is a polymer comprising the following general structure (47):

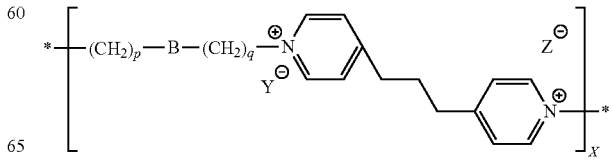

Structure (47)

wherein B, p, q, Y, and Z are as defined with regard to structure (35) and X is an integer of at least 2, preferably from 2 to 100, such as from 2 to 50, and more preferred from 3 to about 20.

One particular leveler compound in the class of levelers of structure (47) is polymer that may be prepared from reacting 1,3-di(pyridin-4-yl)propane and an alkylating agent wherein B is the oxygen atom, p and q are both 2, and Y and Z are both chloride, i.e., 1-chloro-2-(2-chloroethoxy)ethane. This leveler compound is a polymer comprising the following structure (48):

Structure (48)

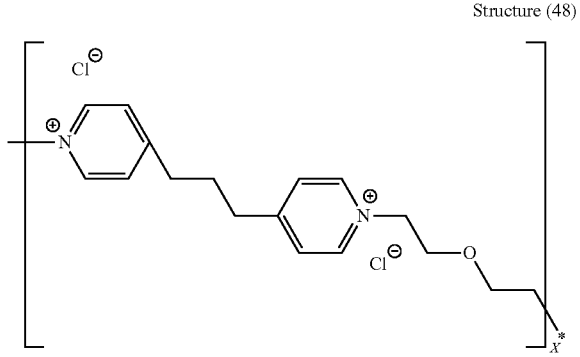

wherein X is an integer of at least 2, preferably from 2 to 100, such as from 2 to 50, and more preferred from 3 to about 20, such as from about 4 to about 8, or from about 12 to about 16. In one preferred leveler of structure (48), X is an average value from about 5 to about 6. In one preferred leveler of structure (48), X is an average value from about 13 to about 14.

In some embodiments, the leveler compounds may be prepared by reacting a dipyridyl compound having the structure (27) and an alkylating agent having the general structure depicted above in Structure (35) in a manner that does not form a polymeric leveler. That is, the levelers may be prepared by selecting reaction conditions, i.e., temperature, concentration, in which the alkylating agent such that the dipyridyl compound and alkylating agent react but do not polymerize. The leveler compound may comprise the following structure (49):

Structure (49)

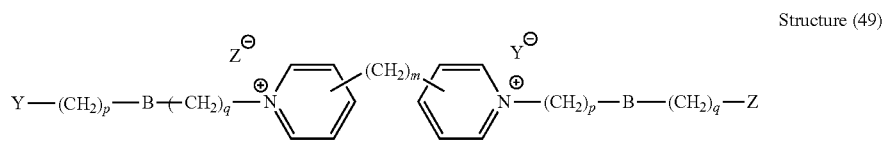

wherein B, m, p, q, Y, and Z are as defined with regard to structures (27) and (35).

As stated above, preferred dipyridyl compounds have general structure (27) such that preferred levelers are based on 4,4'-dipyridyl compounds. In some preferred embodiments, the leveler compound is a reaction product of 4,4'-dipyridyl of structure (31) and an alkylating agent of structure (35) and may comprise the following structure (50):

Structure (50)

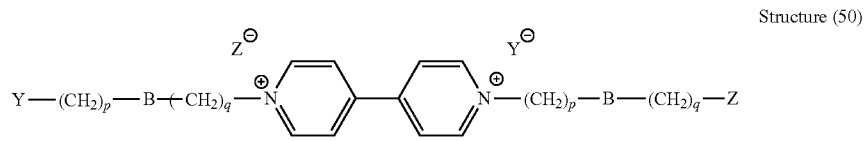

wherein B, p, q, Y, and Z are as defined with regard to Structure (35).

One particular leveler compound in the class of levelers of structure (50) is the reaction product of the 4,4'-dipyridyl and an alkylating agent wherein B is the oxygen atom, p and q are both 2, and Y and Z are both chloride, i.e., 1-chloro-2-(2-chloroethoxy)ethane. This leveler compound may comprise the following structure (51):

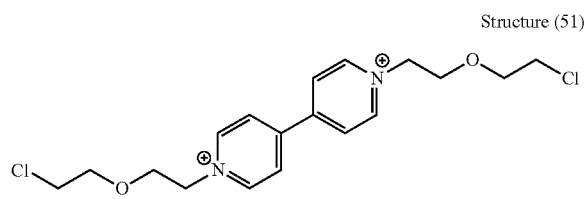 [SMILES: ClCCOCC[n+]1ccc(-c2cc[n+](CCOCCCl)cc2)cc1]

Structure (51)

In some preferred embodiments, the leveler compound is a reaction product of 4,4'-dipyridyl of structure (32) and an alkylating agent of structure (35). In some embodiments, therefore, the leveler compound may comprise the following structure (52):

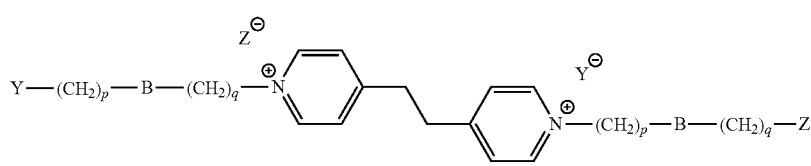

Structure (52)

wherein B, p, q, Y, and Z are as defined with regard to structure (35).

One particular leveler compound in the class of levelers of structure (52) is the reaction product of the 4,4'-ethylenedipyridine and an alkylating agent wherein B is the oxygen atom, p and q are both 2, and Y and Z are both chloride, i.e., 1-chloro-2-(2-chloroethoxy)ethane. This leveler compound may comprise the following structure (53):

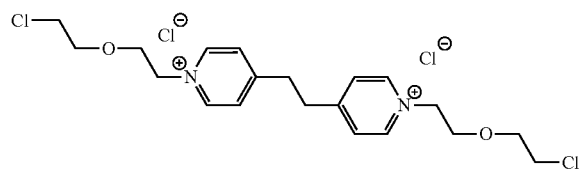

Structure (53)

Another leveler compound in the class of levelers of structure (52) is a polymer that may be prepared by reacting 4,4'-ethylenedipyridine and an alkylating agent wherein B is the ethylene glycol, p and q are both 2, and Y and Z are both chloride, i.e., 1,2-bis(2-chloroethoxy)ethane. This leveler compound may comprise the following structure (54):

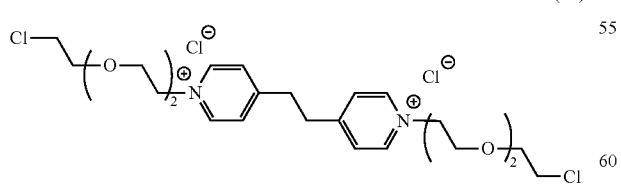

Structure (54)

In some embodiments, the leveler compound may be prepared by reacting a dipyridyl molecule having the structure (27) and an alkylating agent having the general structure (34) depicted above in structure (34). This leveler compound may comprise the following structure (55):

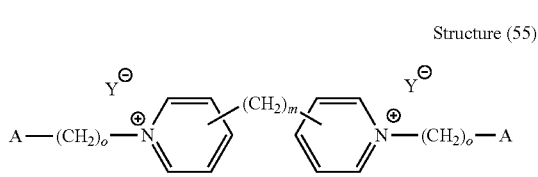

Structure (55)

wherein A, m, o, and Y are as defined with regard to structures (27) and (34).

In some preferred embodiments, the leveler compound is a reaction product of 4,4'-dipyridyl of structure (32) and an alkylating agent of structure (34). In some embodiments, therefore, the leveler compound may comprise the following structure (56):

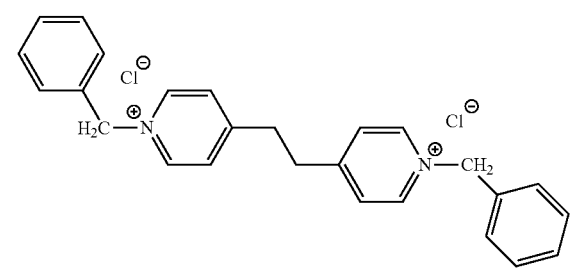

Structure (56)

wherein A, o, and Y are as defined with regard to structure (34).

One particular leveler compound in the class of levelers of structure (56) is the reaction product of the 4,4'-ethylenedipyridine and an alkylating agent wherein A is the phenyl group, o is 1, and Y is chloride, i.e., benzyl chloride. This leveler compound may comprise the following structure (57):

Structure (57)

The leveler concentration may range from about 1 ppm to about 100 ppm, such as between about 2 ppm to about 50 ppm, preferably between about 2 ppm and about 20 ppm, more preferably between about 2 ppm and about 10 ppm, such as between about 5 ppm and about 10 ppm.

There are a number of process steps in preparing a wafer-to-wafer stack or chip-to-wafer stack involving through silicon via metallization. The wafer substrate (i.e., device wafer) for metallization using the electrolytic copper deposition solution of the present invention comprises a back surface, a front surface, and vias and through silicon vias, which are prepared by photolithography and etching methods as is conventionally known. In the context of the present invention, the front surface refers to the active side of the device wafer substrate. Accordingly, vias and through silicon vias have openings that extend from the front surface of the wafer substrate to a depth defined by the length of their sidewalls. In a typical process, conventional photoresist material is applied to a cleaned and dried surface of a device wafer by spin coating. The photoresist may be soft-baked to remove excess solvent at a temperature between about 60° C. and about 100° C. for about 5 to 30 minutes. After soft-baking, the photoresist is exposed to ultraviolet light in a manner that defines the pattern of copper metallization. Exposed photoresist is then dissolved using a developer solution. The wafer and photoresist defining the copper metallization pattern is then hard-baked, typically between about 120° C. and about 180° C. for about 20 to 30 minutes. The exposed wafer is then etched by means known in the art to define a pattern of vias having sidewalls and bottoms. The front surface of the wafer substrate and the sidewalls and the bottoms of the vias (including through silicon vias) are then coated with a barrier layer, which may be titanium nitride, tantalum, tantalum nitride, or ruthenium to inhibit copper diffusion. Next, the barrier layer is typically seeded with a seed layer of copper or other metal to initiate copper superfilling plating thereon. A copper seed layer may be applied by chemical vapor deposition (CVD), physical vapor deposition (PVD), or the like. The vias having barrier layers and copper seed layers are then plated using the electrolytic copper deposition composition and method of the present invention. Prior to metallization, the wafer surface having TSV features therein may optionally be pretreated to ensure proper wetting of the vias with the Cu filling chemistry. An exemplary solution useful for degassing the wafer surface if MICROFAB® PW 1000, available from Enthone Inc. (West Haven, Conn.). After degassing, TSV features located in the wafer is copper metallized using the electrolytic copper deposition composition of the present invention.

The exact configuration of the plating equipment is not critical to the invention. If line power is used for the electrolysis, the electrolytic circuit includes a rectifier for converting the alternating current to direct current and a potentiostat by which the polarity of the electrodes may be reversed and the applied potential controlled to achieve the current pattern utilized in the process of the invention. A membrane separator may be used to divide the chamber containing the electrolytic solution into an anode chamber in which a portion of the electrolytic solution comprising an anolyte is in contact with the anode and a cathode chamber in which a portion of the electrolytic solution comprising a catholyte is in contact with the metalizing surface, which functions as the cathode during the forward current plating process. The cathode and anode may be horizontally or vertically disposed in the tank.

During operation of the electrolytic plating system, copper metal is plated on the surface of a cathode substrate when the power source is energized and power directed through the rectifier to the electrolytic circuit. The bath temperature is typically between about 15° and about 60° C., preferably between about 35° and about 45° C. It is preferred to use an anode to cathode ratio of about 1:1, but this may also vary widely from about 1:4 to 4:1. The process also uses mixing in the electrolytic plating tank which may be supplied by agitation or preferably by the circulating flow of recycle electrolytic solution through the tank.

When introducing elements of the present invention or the preferred embodiment(s) thereof, the articles "a", "an", "the" and "said" are intended to mean that there are one or more of the elements. The terms "comprising", "including" and "having" are intended to be inclusive and mean that there may be additional elements other than the listed elements.

As various changes could be made in the above without departing from the scope of the invention, it is intended that all matter contained in the above description and shown in the accompanying drawings shall be interpreted as illustrative and not in a limiting sense.

What is claimed is:

1. A process for metalizing a through silicon via feature in a semiconductor integrated circuit device, said device comprising a surface having a via feature therein, said via feature comprising a sidewall extending from said surface and a bottom, said sidewall, said bottom and said surface having a metalizing substrate thereon for deposition of copper, said metalizing substrate comprising a seed layer, the process comprising:

immersing said metalizing substrate in an electrolytic copper deposition composition, wherein the through silicon via feature has an entry dimension between 1 micrometers and 25 micrometers, a depth dimension between 50 micrometers and 300 micrometers, and an aspect ratio greater than 2:1, said metalizing substrate providing a cathode for electrolytic deposition of copper thereon, the electrolytic deposition composition comprising:
 a source of copper ions;
 an acid component selected from among an inorganic acid, an organic sulfonic acid, and mixtures thereof;
 an accelerator;
 a suppressor;
 a leveler; and
 chloride ions;
establishing an electrodeposition circuit comprising an anode, the electrolytic deposition composition, the cathode, and a power source;
applying a potential between the anode and the cathode during a via filling cycle to establish an anodic polarity at the anode and a cathodic polarity at the cathode to generate an electrodeposition current and cause reduction of copper ions at the cathode to plate copper onto the metalizing substrate at the bottom and sidewall of the via, the via preferentially plating on the bottom and lower sidewall to cause filling of the via from the bottom with copper;
reversing a polarity of said electrodeposition circuit during the via filling cycle for at least one interval to generate an anodic potential at said metalizing substrate;
resuming copper deposition by re-establishing a surface of the copper plated within the via as the cathode in the circuit, thereby yielding a copper filled via feature;
wherein a ratio of cumulative charge transfer in said circuit during copper deposition within said filling cycle to cumulative charge transfer during a sum of all anodic potential intervals is at least 80:1.

2. A process as set forth in claim 1 wherein the polarity of the circuit is reversed to provide an anodic potential at said metalizing substrate in a plurality of intervals during said filling cycle.

3. A process as set forth in claim 1 wherein the ratio of cumulative charge transfer in the electrodeposition circuit during copper deposition within the via filling cycle to cumulative charge transfer during the sum of all said anodic potential intervals at said metalizing substrate is between 500:1 and 100,000:1, between 1,000:1 and 50,000:1, or between 3,000:1 and 30,000:1.

4. A process as set forth in claim 2 wherein a cumulative extent of anodic charge transfer at said metalizing substrate in the sum of all said anodic potential intervals is less than an average of 1.8 coulombs/cm$^2$ integrated over the total electrodic surface area of the metalizing substrate.

5. A process as set forth in claim 2 wherein a cumulative duration of all anodic potential intervals at said metalizing substrate during said filling cycle is not more than 50 seconds.

6. A process as set forth in claim 2 wherein at least one of said anodic potential intervals prevails for a period of at least 0.1 seconds.

7. A process as set forth in claim 2 wherein at least one of said anodic potential intervals prevails for a period of at least 0.5 seconds.

8. A process as set forth in claim 2 wherein at least one of said anodic potential intervals prevails for a period between 0.1 and 100 seconds.

9. A process as set forth in claim 2 in which each of at least two of said anodic potential intervals prevails for a period of at least 0.1 second.

10. A process as set forth in claim 2 wherein at least one of said anodic potential intervals prevails to an extent of an average charge transfer of at least $5\times10^{-5}$ coulombs/cm$^2$ integrated over a total electrodic area of said metalizing substrate.

11. A process as set forth in claim 1 wherein said filling cycle comprises a plurality of anodic potential intervals of material duration, wherein of the plurality of anodic potential intervals of material duration extends for a period of at least 0.6 seconds, the period of cathodic current at said metalizing substrate between successive anodic potential intervals of material duration being at least 0.5 minutes.

12. A process as set forth in claim 1 wherein said filling cycle comprises a plurality of faradaically material anodic potential intervals at said metalizing substrate in each of which an average anodic charge transfer is at least $5\times10^{-5}$ coulombs/cm$^2$ integrated over a total electrodic area of said metalizing substrate, and wherein, between successive faradaically material anodic potential intervals, an integrated average cathodic current charge transfer over a total surface area of said cathode is at least $1.5\times10^{-2}$ coulombs/cm$^2$.

13. A process as set forth in claim 11 wherein, during each said anodic potential interval of material duration, a current density across an electrode surface of the metalizing substrate is maintained at an average of between 0.1 and 100 mA/cm$^2$ integrated over a total electrodic area of said metalizing substrate.

14. A process as set forth in claim 13 wherein during each of the plurality of anodic potential interval of material duration and during each said faradaically material anodic potential interval, the current density across the electrode surface of the metalizing substrate is maintained at an average of between 0.1 and 10 mA/cm$^2$ integrated over the total electrodic area of said metalizing substrate.

15. A process as set forth in claim 1 wherein the via is at least 90% filled after a filling cycle of no greater than 90 minutes.

16. A process as set forth in claim 1 wherein the copper filled via is at least one of substantially free of seams and voids or substantially free of mounds and protrusions.

17. A process as set forth in claim 2 wherein each of said anodic potential intervals is effective to desorb leveler from an electrodic surface, whereby an average current density integrated over a total electrodic area of the metalizing substrate is increased upon resumption of cathodic current relative to the current density prior to said anodic potential interval.

18. A process as set forth in claim 17 wherein said anodic potential intervals are effective to desorb suppressor from the surface of the copper plated within the via.

19. A process as set forth in claim 1 wherein:
the polarity of the circuit is reversed to provide an anodic potential at said metalizing substrate in a plurality of intervals during said filling cycle; and
a cumulative duration of all anodic potential intervals at said metalizing substrate during said filling cycle is not more than 50 seconds; at least one of said anodic potential intervals prevails for a period of at least 0.5 seconds and each of at least two of said anodic potential intervals prevails for a period of at least 0.1 second.

20. A process as set forth in claim 19 wherein said filling cycle comprises a plurality of anodic potential intervals of material duration, wherein each of the plurality of anodic potential intervals of material duration extends for a period of at least 0.6 seconds, a period of cathodic current at said metalizing substrate between successive anodic potential intervals of material duration being at least 0.5 minutes.

21. A process as set forth in claim 19 wherein said filling cycle comprises a plurality of faradaically material anodic potential intervals at said metalizing substrate in each of which an average anodic charge transfer is at least $5\times10^{-5}$ coulombs/cm$^2$ integrated over a total electrodic surface area of said metalizing substrate, and wherein, between successive faradaically material anodic potential intervals, an integrated average cathodic current charge transfer over the total electrodic surface area of said cathode is at least $1.5\times10^{-2}$ coulombs/cm$^2$.

22. A process for metalizing a through silicon via feature in a semiconductor integrated circuit device, said device comprising a surface having a via feature therein, said via feature comprising a sidewall extending from said surface and a bottom, said sidewall, said bottom and said surface having a metalizing substrate thereon for deposition of copper, said metalizing substrate comprising a seed layer, the process comprising:
immersing said metalizing substrate in an electrolytic copper deposition composition, wherein the through silicon via feature has an entry dimension between 1 micrometers and 25 micrometers, a depth dimension between 50 micrometers and 300 micrometers, and an aspect ratio greater than 2:1, said metalizing substrate providing a cathode for electrolytic deposition of copper thereon, the deposition composition comprising:
a source of copper ions;
an acid component selected from among an inorganic acid, an organic sulfonic acid, and mixtures thereof;
an accelerator;
a suppressor;
a leveler; and
chloride ions;

establishing an electrodeposition circuit comprising an anode, the electrolytic deposition composition, the cathode, and a power source;

applying a potential between the anode and the cathode during a via filling cycle to establish a positive polarity at the anode and a negative polarity at the cathode to generate an electrodeposition current and cause reduction of copper ions at the cathode to plate copper onto the metalizing substrate at the bottom and sidewall of the via, the via preferentially plating on the bottom and lower sidewall to cause filling of the via from the bottom with copper;

reversing a polarity of said electrodeposition circuit during the via filling cycle for at least one interval to generate an anodic potential at said metalizing substrate;

resuming copper deposition by re-establishing a surface of the copper plated within the via as the cathode in the circuit, thereby yielding a copper filled via feature;

wherein the via filling cycle comprises a plurality of faradaically material anodic potential intervals in each of which an average anodic charge transfer is at least $3\times10^{-4}$ coulombs/cm$^2$ integrated over a total electrodic surface area of said metalizing substrate, and wherein between successive faradaically material anodic potential intervals, an integrated average cathodic current charge transfer over the total electrodic surface area of said metalizing substrate is at least $1.5\times10^{-2}$ coulombs/cm$^2$.

23. A process for metalizing a through silicon via feature in a semiconductor integrated circuit device, said device comprising a surface having a via feature therein, said via feature comprising a sidewall extending from said surface, and a bottom, said sidewall, said bottom and said surface having a metalizing substrate thereon for deposition of copper, said metalizing substrate comprising a seed layer, the process comprising:

immersing said metalizing substrate with an electrolytic copper deposition composition, wherein the through silicon via feature has an entry dimension between 1 micrometers and 25 micrometers, a depth dimension between 50 micrometers and 300 micrometers, and an aspect ratio greater than 2:1, said metalizing substrate providing a cathode for electrolytic deposition of copper thereon, the deposition composition comprising:
a source of copper ions;
an acid component selected from among an inorganic acid, an organic sulfonic acid, and mixtures thereof;
an accelerator;
a suppressor;
a leveler; and
chloride ions;

establishing an electrodeposition circuit comprising an anode, the electrolytic deposition composition, the cathode, and a power source;

applying a potential between the anode and the cathode during a via filling cycle to establish a positive polarity at the anode and a negative polarity at the cathode to generate an electrodeposition current and cause reduction of copper ions at the cathode to plate copper onto the metalizing substrate at the bottom and sidewall of the via, the via preferentially plating on the bottom and lower sidewall to cause filling of the via from the bottom with copper;

reversing a polarity of said electrodeposition circuit during the via filling cycle for at least one interval to generate an anodic potential at said metalizing substrate;

resuming copper deposition by re-establishing a surface of the copper plated within the via as the cathode in the circuit, thereby yielding a copper filled via feature;

the method further comprising:

reversing the polarity of the circuit to provide an anodic potential at said metalizing substrate in a plurality of intervals during the filling cycle;

wherein a ratio of cumulative charge transfer in said circuit during copper deposition within said filling cycle to cumulative charge transfer during the sum of all intervals of anodic potential at said metalizing substrate is at least 50:1;

wherein said filling cycle comprises a plurality of anodic potential intervals of material duration, and each of said anodic intervals of material duration extends for a period of at least 0.6 seconds, a period of cathodic current at said metalizing substrate between successive anodic potential intervals of material duration being at least 0.5 minutes;

wherein a cumulative duration of all anodic potential intervals at said metalizing substrate during said filling cycle is not more than 50 seconds;

wherein a cumulative extent of anodic charge transfer at said metalizing substrate in the sum of all said anodic potential intervals is not greater than an average of 1.8 coulombs/cm$^2$ integrated over the total electrodic surface area of said metalizing substrate;

wherein during each said anodic potential interval of material duration, a current density across an electrode surface of the metalizing substrate is maintained at an average of between 0.1 and 100 mA/cm$^2$ integrated over a total electrodic surface area of said metalizing substrate;

wherein each of said anodic potential intervals is effective to desorb leveler from the electrodic surface, whereby the average current density integrated over the total electrodic surface area of said metalizing substrate is increased upon resumption of cathodic current relative to a current density prior to said anodic potential interval;

wherein said anodic potential intervals are effective to desorb suppressor from the surface of the copper within the via;

wherein a ratio of cumulative duration of cathodic current during copper deposition within said filling cycle to cumulative duration of all anodic potential intervals at said metalizing substrate is at least 80:1; and wherein the copper filled via is at least one of substantially free of seams and voids or substantially free of mounds and protrusions.

24. A process as set forth in claim 23 wherein the ratio of cumulative charge transfer in said circuit during copper deposition within said filling cycle to the cumulative charge transfer during the sum of all intervals of anodic potential at said metalizing substrate is between 500:1 and 100,000:1.

* * * * *